(12) United States Patent
Chen et al.

(10) Patent No.: US 12,068,285 B2
(45) Date of Patent: Aug. 20, 2024

(54) STACKED DIE STRUCTURE AND METHOD OF FABRICATING THE SAME

(71) Applicant: Taiwan Semiconductor Manufacturing Company, Ltd., Hsinchu (TW)

(72) Inventors: Jie Chen, New Taipei (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 13 days.

(21) Appl. No.: 17/676,233

(22) Filed: Feb. 21, 2022

(65) Prior Publication Data
US 2022/0173077 A1    Jun. 2, 2022

Related U.S. Application Data

(62) Division of application No. 16/876,108, filed on May 17, 2020, now Pat. No. 11,257,791.

(Continued)

(51) Int. Cl.
    *H01L 25/065*    (2023.01)
    *H01L 23/00*     (2006.01)
    (Continued)

(52) U.S. Cl.
    CPC ...... *H01L 25/0657* (2013.01); *H01L 23/5226* (2013.01); *H01L 23/5286* (2013.01); *H01L 24/13* (2013.01); *H01L 25/50* (2013.01)

(58) Field of Classification Search
    CPC ....... H01L 25/0657; H01L 2224/32145; H01L 2224/73217; H01L 2224/73267; H01L 2224/92244; H01L 2224/0401; H01L 2224/16227; H01L 2224/1703; H01L 2224/73203; H01L 2224/4105; H01L 2224/12105; H01L 2224/73253;
    (Continued)

(56) References Cited

U.S. PATENT DOCUMENTS 8,802,504 B1    8/2014  Hou et al.
8,803,292 B2    8/2014  Chen et al.
(Continued)

*Primary Examiner* — Victor A Mandala
*Assistant Examiner* — Lawrence C Tynes, Jr.
(74) *Attorney, Agent, or Firm* — JCIPRNET

(57) ABSTRACT

A stacked die structure includes a base die, a top die and conductive terminals electrically connected to the top die. The base die includes a base semiconductor substrate, a base interconnection layer disposed on the base semiconductor substrate, and a base bonding layer disposed on the base interconnection layer. The top die is stacked on the base die and electrically connected to the base die, wherein the top die includes a top bonding layer, a top semiconductor substrate, a top interconnection layer, top conductive pads and top grounding vias. The top bonding layer is hybrid bonded to the base bonding layer. The top interconnection layer is disposed on the top semiconductor substrate and includes a dielectric layer, conductive layers embedded in the dielectric layer, and conductive vias joining the conductive layers. The conductive pads and top grounding vias are embedded in the dielectric layer and disposed on the conductive layers.

20 Claims, 22 Drawing Sheets

Related U.S. Application Data

(60) Provisional application No. 62/892,556, filed on Aug. 28, 2019.

(51) Int. Cl.
*H01L 23/522* (2006.01)
*H01L 23/528* (2006.01)
*H01L 25/00* (2006.01)

(58) Field of Classification Search
CPC ... H01L 2225/06562; H01L 2225/1058; H01L 24/19; H01L 24/18; H01L 24/16; H01L 24/17; H01L 24/32; H01L 24/73; H01L 23/3128
See application file for complete search history.

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2015/0235949 A1* | 8/2015 | Yu ................ H01L 25/0652 257/774 |
| 2018/0277517 A1* | 9/2018 | Kim ................ H10B 61/22 |
| 2018/0350745 A1* | 12/2018 | Hsieh ................ H01L 24/83 |
| 2020/0105635 A1* | 4/2020 | Yu ................ H01L 23/3677 |

* cited by examiner

STACKED DIE STRUCTURE AND METHOD OF FABRICATING THE SAME

CROSS-REFERENCE TO RELATED APPLICATION

This application is a divisional application of U.S. application Ser. No. 16/876,108, filed on May 17, 2020, now allowed. The prior application Ser. No. 16/876,108 claims the priority benefit of U.S. provisional application Ser. No. 62/892,556, filed on Aug. 28, 2019. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many semiconductor integrated circuits are typically manufactured on a single semiconductor wafer. Dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
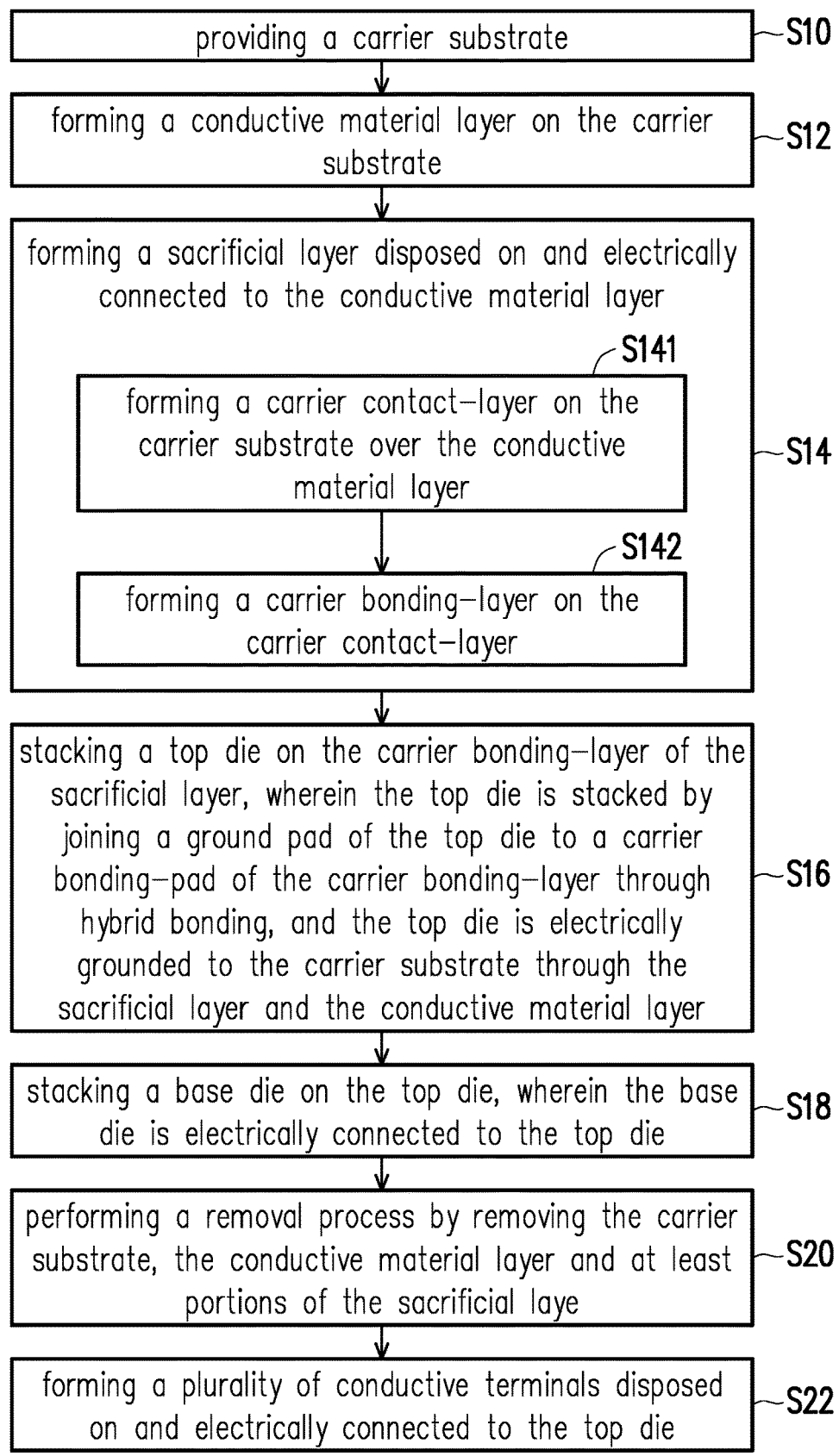
FIG. 1 is an exemplary flow chart showing the process steps of a method of fabricating a stacked die structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is an exemplary flow chart showing the process steps of a method of fabricating a stacked die structure according to some exemplary embodiments of the present disclosure. The various process steps of the process flow illustrated in FIG. 1 may comprise multiple process steps as discussed below. FIG. 2A to FIG. 2M are schematic sectional views of various stages in a method of fabricating a stacked die structure according to some exemplary embodiments of the present disclosure.

Figure 2A:
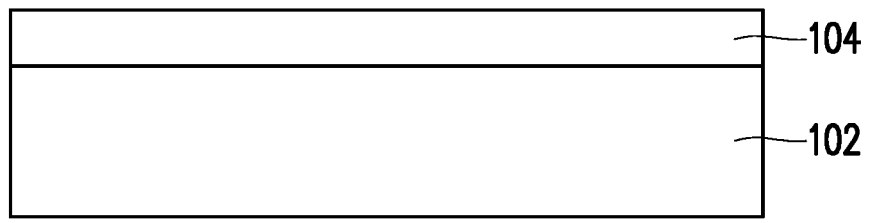
FIG. 2A to FIG. 2M are schematic sectional views of various stages in a method of fabricating a stacked die structure according to some exemplary embodiments of the present disclosure.

Referring to step S10 in FIG. 1 and as illustrated in FIG. 2A, a carrier substrate 102 is provided. In some embodiments, the carrier substrate 102 is a doped carrier substrate with various doped regions. In certain embodiments, the carrier substrate 102 is doped by using an inter-diffused multilayer process (IMP). After providing the carrier substrate 102, in step S12 in FIG. 1 and as illustrated in FIG. 2A, a conductive material layer 104 is formed on the carrier substrate 102. For example, in some embodiments, the conductive material layer 104 is a silicide layer formed by a self-align silicide (salicide) process.

Figure 2B:
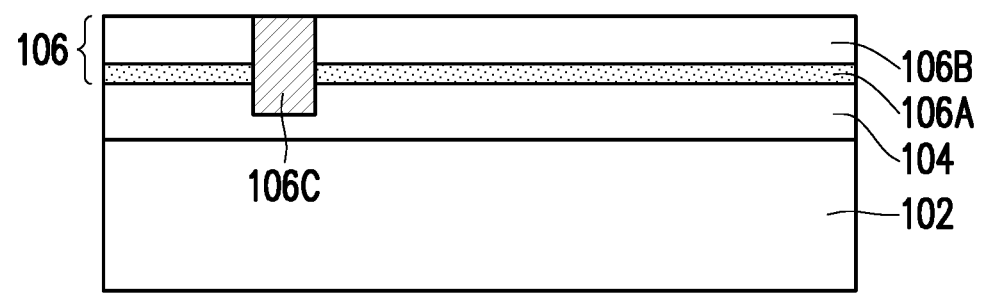
Figure 2C:
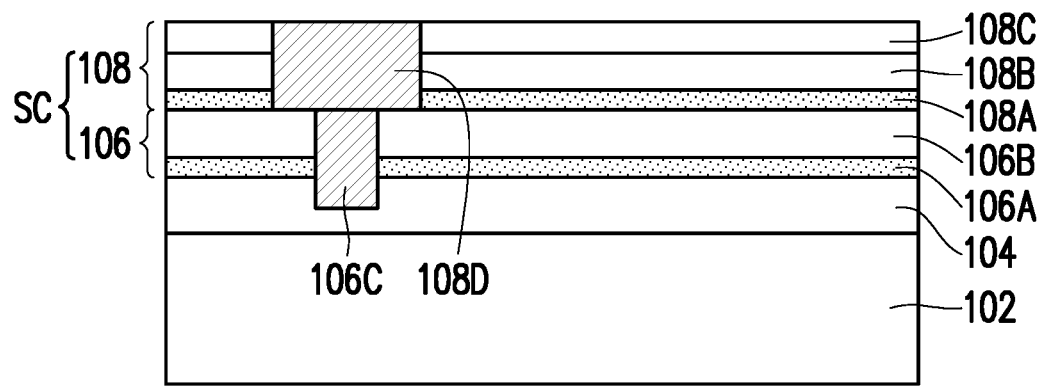

Referring to step S14 in FIG. 1 and as illustrated in FIG. 2B and FIG. 2C, the steps of forming a sacrificial layer SC on the conductive material layer 104 will be described. The formation of the sacrificial layer SC includes multiple steps. For example, in step S141 in FIG. 1 and as illustrated in FIG.

2B, a carrier contact-layer 106 is formed on the carrier substrate 102 over the conductive material layer 104. In some embodiments, the carrier contact-layer 106 is formed by sequentially forming an etch stop layer 106A and a dielectric layer 106B over the conductive material layer 104, then forming a contact structure 106C within the etch stop layer 106A and the dielectric layer 106B. For example, in one embodiment, the etch stop layer 106A is formed to be in contact with a top surface of the conductive material layer 104, and sandwiched in between the conductive material layer 104 and the dielectric layer 106B. After forming the etch stop layer 106A and the dielectric layer 106B, a contact structure 106C is formed to be embedded in the etch stop layer 106A and the dielectric layer 106B, and to be in contact with the conductive material layer 104. In some embodiments, the contact structure 106C is formed and patterned using a photolithography and/or etching process. In certain embodiments, the contact structure 106C is electrically grounded to the carrier substrate 102 through the conductive material layer 104. In some exemplary embodiments, a planarization process (such as chemical mechanical polishing (CMP)) may be performed so that a top surface of the contact structure 106C is aligned with a top surface of the dielectric layer 106B.

Referring to step S142 in FIG. 1 and as illustrated in FIG. 2C, after forming the carrier contact-layer 106, a carrier bonding-layer 108 is formed on the carrier contact-layer 106. The carrier contact-layer 106 and the carrier bonding-layer 108 together constitute a sacrificial layer SC that may be selectively removed in subsequent steps. In some embodiments, the carrier bonding-layer 108 is formed by sequentially forming an etch stop layer 108A, a dielectric layer 108B and a bonding film 108C over the carrier contact-layer 106, then forming a carrier bonding-pad 108D within the etch stop layer 108A, the dielectric layer 108B and the bonding film 108C.

For example, in one exemplary embodiment, the etch stop layer 108A is formed to be in contact with a top surface of the dielectric layer 106B, while the dielectric layer 108B and the bonding film 108C are sequentially stacked over a top surface of the etch stop layer 108A. In certain embodiments, the dielectric layer 108B is located in between the etch stop layer 108A and the bonding film 108C. After forming the etch stop layer 108A, the dielectric layer 108B and the bonding film 108C, a carrier bonding-pad 108D is formed to be embedded within the etch stop layer 108A, the dielectric layer 108B and the bonding film 108C. For example, the carrier bonding-pad 108D is formed to be electrically and physically connected to the contact structure 106C of the carrier contact-layer 106. In some embodiments, the carrier bonding-pad 108D is formed and patterned using a photolithography and/or etching process. In certain embodiments, a planarization process (such as chemical mechanical polishing (CMP)) may be performed so that a top surface of the carrier bonding-pad 108D is aligned with a top surface of the bonding film 108C.

Figure 2D:
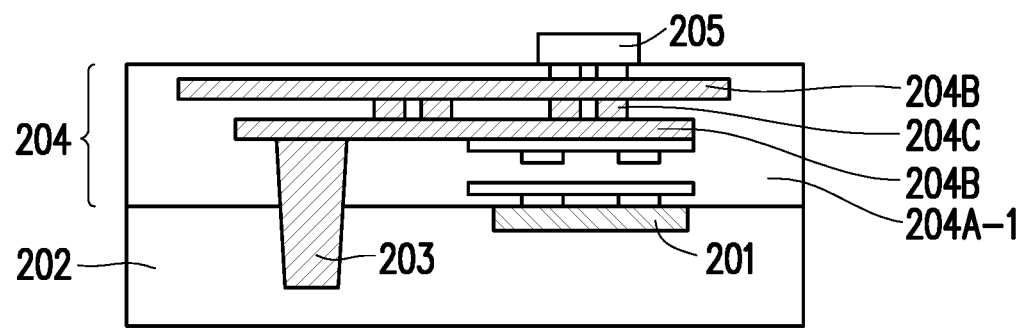
Figure 2E:
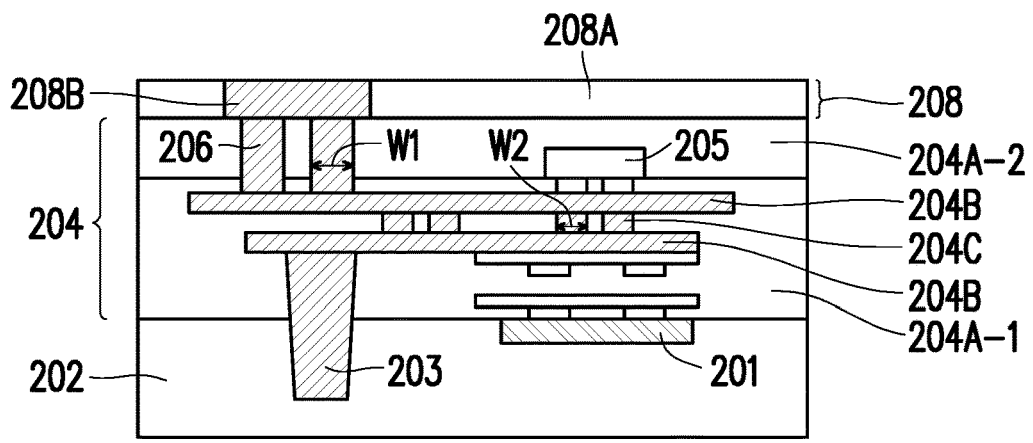

Referring to FIGS. 2D and 2E, the steps of forming a top die TD will then be described. The formation of the top die TD includes multiple steps. As illustrated in FIG. 2D, a top die TD having a top semiconductor substrate 202 and a top interconnection layer 204 is provided. In some embodiments, the top semiconductor substrate 202 may be a bulk silicon substrate or a silicon-on-insulator (SOI) substrate, and further includes device 201 formed therein. For example, the device 201 may be active components (e.g., transistors or the like) and/or passive components (e.g., resistors, capacitors, inductors or the like) that are formed and embedded within the top semiconductor substrate 202.

In some embodiments, the top interconnection layer 204 is formed on the top semiconductor substrate 202 and includes a first dielectric layer 204A-1, a plurality of conductive layers 204B embedded in the first dielectric layer 204A-1, and a plurality of conductive vias 204C joining the plurality of conductive layers 204B. In some embodiments, a through substrate via 203 is formed to be electrically connected to the conductive layers 204B. In certain embodiments, the through substrate via 203 is embedded within the top semiconductor substrate 202 and the first dielectric layer 204A-1 of the top interconnection layer 204.

As illustrated in FIG. 2D, at least one top conductive pad 205 is disposed on the top interconnection layer 204 and electrically connected to the conductive layers 204B of the top interconnection layer 204. In the exemplary embodiment, only one top conductive pad 205 is illustrated for simplification. However, it should be noted that the number of top conductive pads 205 can be more than one. For example, in some embodiments, two or more top conductive pads 205 are located on the top interconnection layer 204. However, the disclosure is not limited thereto, and the number of top conductive pads 205 located on the top interconnection layer 204 may be selected based on design requirement. In some embodiments, the top conductive pads 205 may be aluminum pads, copper pads or other suitable metal pads.

Referring to FIG. 2E, in a next step, a second dielectric layer 204A-2 is formed over the first dielectric layer 204A-1 and to cover the top conductive pads 205. In the exemplary embodiment, the first dielectric layer 204A-1 and the second dielectric layer 204A-2 together constitute the dielectric layer of the top interconnection layer 204. The first dielectric layer 204A-1 and the second dielectric layer 204A-2 may be a silicon oxide layer, a silicon nitride layer, a silicon oxynitride layer or a dielectric layer formed of any suitable dielectric material. In some embodiments, top grounding vias 206 are formed in the second dielectric layer 204A-2. In certain embodiments, after planarization of the second dielectric layer 204A-2 and the top grounding vias 206, a bonding film 208A is formed over the second dielectric layer 204A-2 by deposition. In some embodiments, after forming the bonding film 208A, a ground pad 208B is formed within the bonding film 208A and patterned using a photolithography and/or etching process.

In the exemplary embodiment, the top grounding vias 206 are formed to be embedded in the top interconnection layer 204. For example, the top grounding vias 206 are surrounded by the second dielectric layer 204A-2 and the first dielectric layer 204A-1. In some embodiments, the top grounding vias 206 are located adjacent to the top conductive pads 205, wherein the top grounding vias 206 and the top conductive pads 205 are connected to the same conductive layer 204B. In some embodiments, a width W1 of the top grounding vias 206 is greater than a width W2 of the plurality of conductive vias 204C. In certain embodiments, a ratio of the width W1 to the width W2 (W1:W2) is in a range of 4:1 to 6:1.

Furthermore, in some embodiments, the ground pad 208B is formed over the second dielectric layer 204A-2 and physically connected to the top grounding vias 206. In some embodiments, the ground pad 208B is surrounded by the bonding film 208A. In certain embodiments, a planarization process (such as chemical mechanical polishing (CMP)) may be performed so that a top surface of the ground pad 208B is aligned with a top surface of the bonding film 208A.

The bonding film 208A and the ground pad 208 together constitute a top grounding layer 208. For example, the top grounding layer 208 is located on and electrically connected to the top interconnection layer 204, wherein side surfaces of the top grounding layer 208 and the top interconnection layer 204 are aligned and coplanar with one another.

Figure 2F:
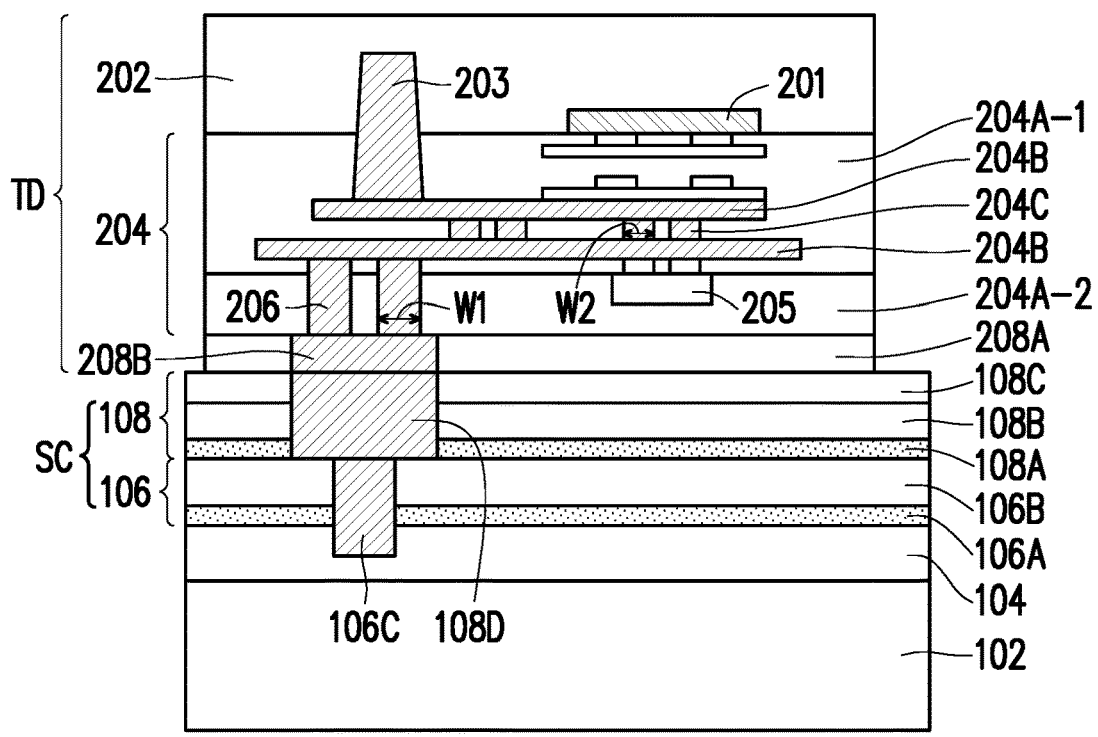

Referring to step S16 in FIG. 1 and as illustrated in FIG. 2F, in a subsequent step, the top die TD obtained in FIG. 2E is stacked on the sacrificial layer SC and over the carrier substrate 102 illustrated in FIG. 2C. In some embodiments, the top die TD is stacked on the carrier bonding-layer 108 by joining the ground pad 208B to the carrier bonding-pad 108D through hybrid bonding. For example, hybrid bonding extends fusion bonding with embedded metal pads (e.g. ground pad 208B and carrier bonding-pad 108D) in the bond interface, allowing for face-to-face connection of layers. Furthermore, in certain embodiments, the bonding film 208A is attached to the bonding film 108C. In some embodiments, the top die TD is electrically grounded to the carrier substrate 102 through the sacrificial layer SC and the conductive material layer 104. For example, the ground pad 208B of the top die TD is electrically connected to the conductive material layer 104 through the contact structure 106C and the carrier bonding-pad 108D.

Figure 2G:
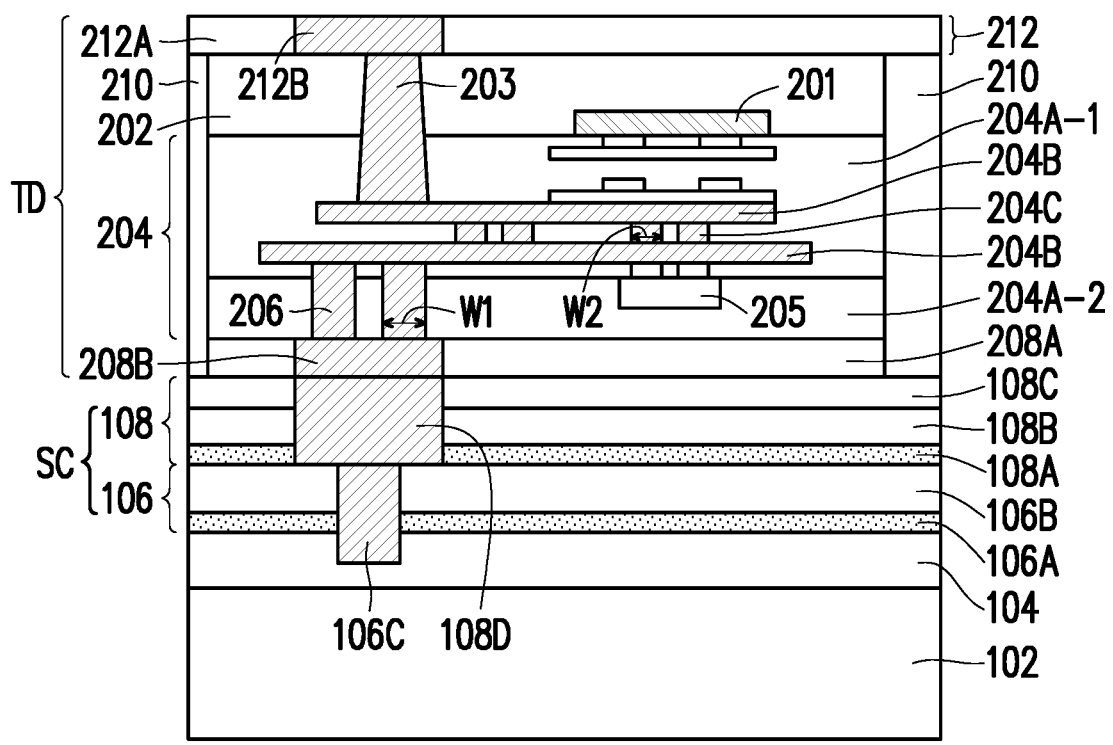

Referring to FIG. 2G, after stacking the top die TD over the sacrificial layer SC, a gap filling material 210 is formed over the sacrificial layer SC to surround the top semiconductor substrate 202 and the top interconnection layer 204. For example, the gap filling material 210 fill up the gaps so that sidewalls of the gap filling material 210 is aligned with sidewalls of the sacrificial layer SC. In some embodiments, the gap filling material 210 is a gap filling oxide material. However, the disclosure is not limited thereto. In some embodiments, after forming the gap filling material 210, a planarization process is performed to thin down the top semiconductor substrate 202 and to reveal the through substrate via 203. Thereafter, a top bonding layer 212 including a top bonding pad 212B embedded in a dielectric layer 212A is formed over the thinned top semiconductor substrate 202 through photolithography and/or etching processes. In certain embodiments, another planarization process (such as chemical mechanical polishing (CMP)) may be performed so that a top surface of the top bonding pad 212B is aligned with a top surface of the dielectric layer 212A. In the exemplary embodiment, the gap filling material 210 and the top bonding layer 212 are formed to complete the formation of the top die TD. In other words, the gap filling material 210 and the top bonding layer 212 also constitute part of the top die TD.

Figure 2H:
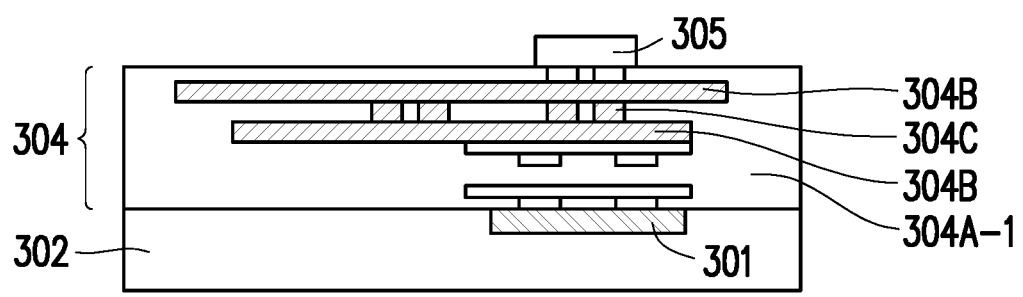
Figure 2I:
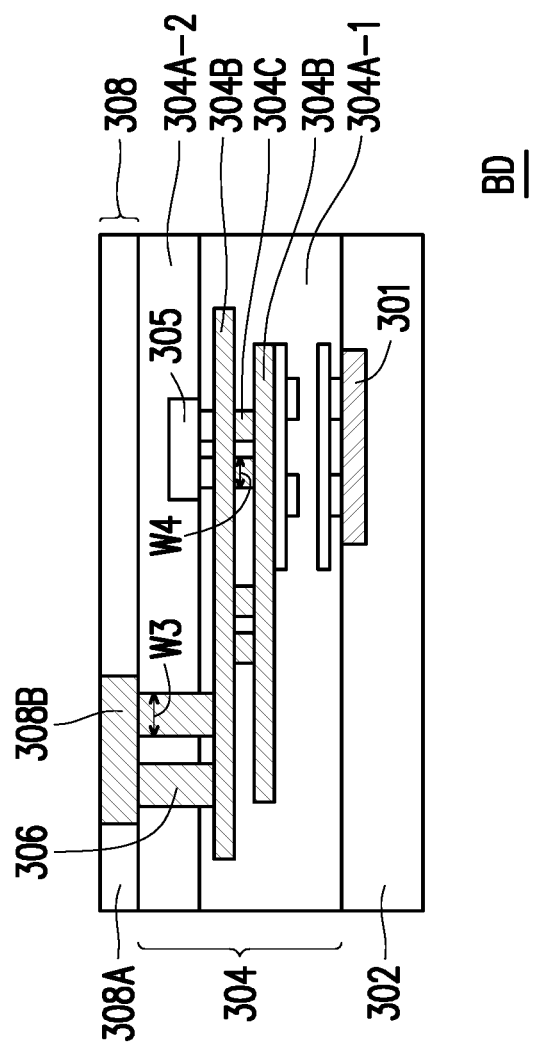

Referring to FIGS. 2H and 2I, the steps of forming a base die BD will then be described. As illustrated in FIG. 2H, a base die BD having a base semiconductor substrate 302 and a base interconnection layer 304 is provided. In some embodiments, the base semiconductor substrate 302 may be a bulk silicon substrate or a silicon-on-insulator (SOI) substrate, and further includes device 301 formed therein. For example, the device 301 may be active components (e.g., transistors or the like) and/or passive components (e.g., resistors, capacitors, inductors or the like) that are formed and embedded within the top semiconductor substrate 302.

In some embodiments, the base interconnection layer 304 is formed on the base semiconductor substrate 302 and includes a first dielectric layer 304A-1, a plurality of conductive layers 304B embedded in the first dielectric layer 304A-1, and a plurality of conductive vias 304C joining the plurality of conductive layers 304B. Furthermore, at least one base conductive pad 305 is disposed on the base interconnection layer 304 and electrically connected to the conductive layers 304B of the base interconnection layer 304. In the exemplary embodiment, the number of base conductive pads 305 located on the base interconnection layer 304 may be selected based on design requirement. In some embodiments, the base conductive pads 305 may be aluminum pads, copper pads or other suitable metal pads.

Referring to FIG. 2I, in a next step, a second dielectric layer 304A-2 is formed over the first dielectric layer 304A-1 and to cover the base conductive pads 305. In the exemplary embodiment, the first dielectric layer 304A-1 and the second dielectric layer 304A-2 together constitute the dielectric layer of the base interconnection layer 304. The first dielectric layer 304A-1 and the second dielectric layer 304A-2 may be a silicon oxide layer, a silicon nitride layer, a silicon oxy-nitride layer or a dielectric layer formed of any suitable dielectric material. In some embodiments, base grounding vias 306 are formed in the second dielectric layer 304A-2. In certain embodiments, after planarization of the second dielectric layer 304A-2 and the base grounding vias 306, a bonding film 308A is formed over the second dielectric layer 304A-2 by deposition. In some embodiments, after forming the bonding film 308A, a base bonding pad 308B is formed within the bonding film 308A and patterned using a photolithography and/or etching process.

In the exemplary embodiment, the base grounding vias 306 are formed to be embedded in the base interconnection layer 304. For example, the base grounding vias 306 are surrounded by the second dielectric layer 304A-2 and the first dielectric layer 304A-1. In some embodiments, the base grounding vias 306 are located adjacent to the base conductive pad 305, wherein the base grounding vias 306 and the base conductive pads 305 are connected to the same conductive layer 304B. In some embodiments, a width W3 of the base grounding vias 306 is greater than a width W4 of the plurality of conductive vias 304C. In certain embodiments, a ratio of the width W3 to the width W4 (W3:W4) is in a range of 4:1 to 6:1.

In some embodiments, the base bonding pad 308B is formed over the second dielectric layer 304A-2 and physically connected to the base grounding vias 306. In some embodiments, the base bonding pad 308B is surrounded by the bonding film 308A. In certain embodiments, a planarization process (such as chemical mechanical polishing (CMP)) may be performed so that a top surface of the base bonding pad 308B is aligned with a top surface of the bonding film 308A. The bonding film 308A and the base bonding pad 308B together constitute a base bonding layer 308. For example, the base bonding layer 308 is located on and electrically connected to the base interconnection layer 304, wherein side surfaces of the base bonding layer 308 and the base interconnection layer 304 are aligned or coplanar with one another.

Figure 2J:
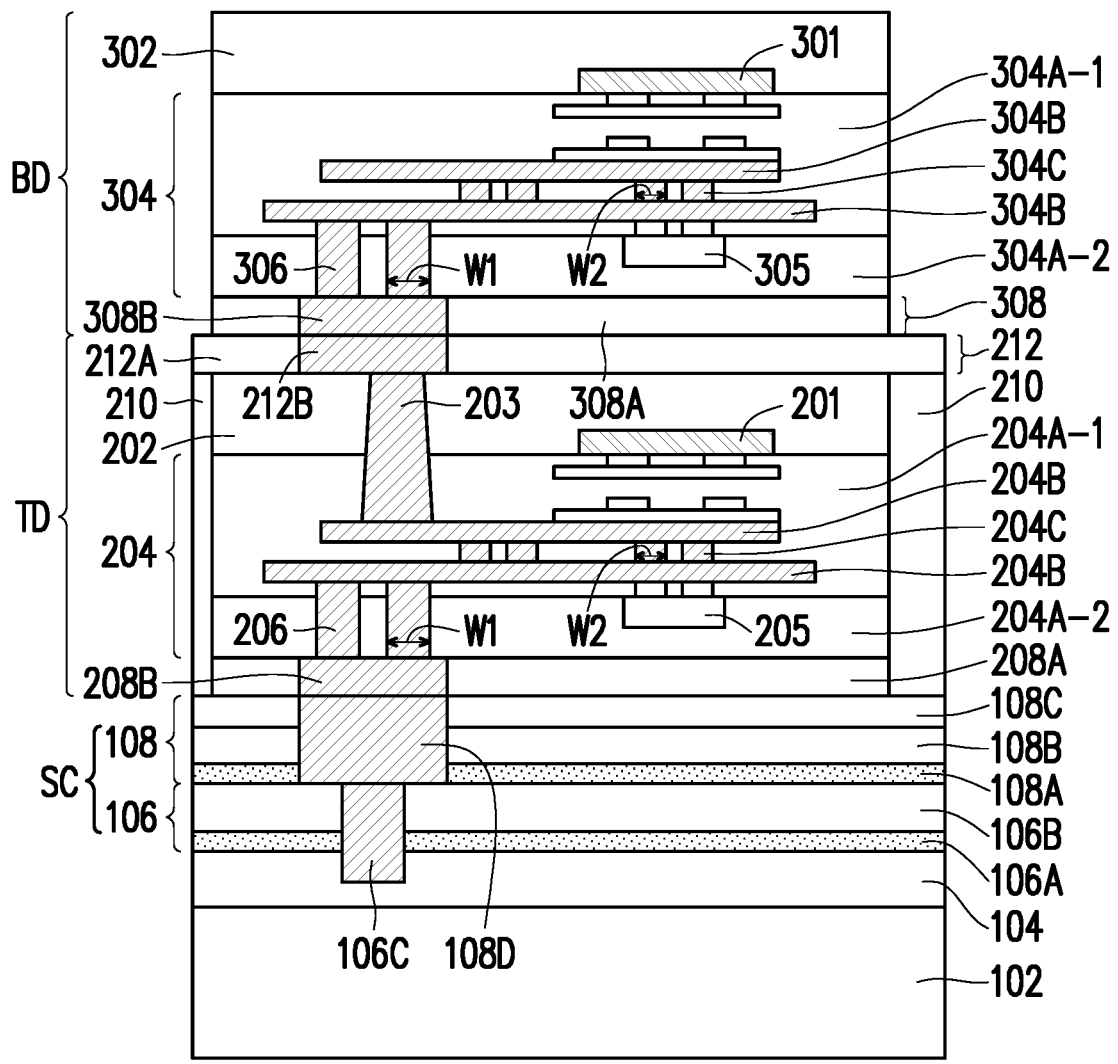

Referring to step S18 in FIG. 1 and as illustrated in FIG. 2J, in a subsequent step, the base die BD obtained in FIG. 2I is stacked on the top die TD and over the sacrificial layer SC illustrated in FIG. 2G. In some embodiments, the base die BD is stacked on the top die TD by joining the base bonding layer 308 of the base die BD to the top bonding layer 212 of the top die TD through hybrid bonding. For example, the base bonding pad 308B is physically joined with the top bonding pad 212B through hybrid bonding. In some embodiments, the base die BD is electrically grounded to the carrier substrate 102 through the top die TD, the sacrificial layer SC and the conductive material layer 104. In certain embodiments, the base bonding pad 308B of the base die BD is electrically connected to the conductive material layer 104 through an electrical path passing by the through substrate via 203, the conductive layers 204B, the conductive vias 204C, the top grounding vias 206, the ground pad 208B, and through the contact structure 106C and the carrier bonding-pad 108D.

Figure 2K:
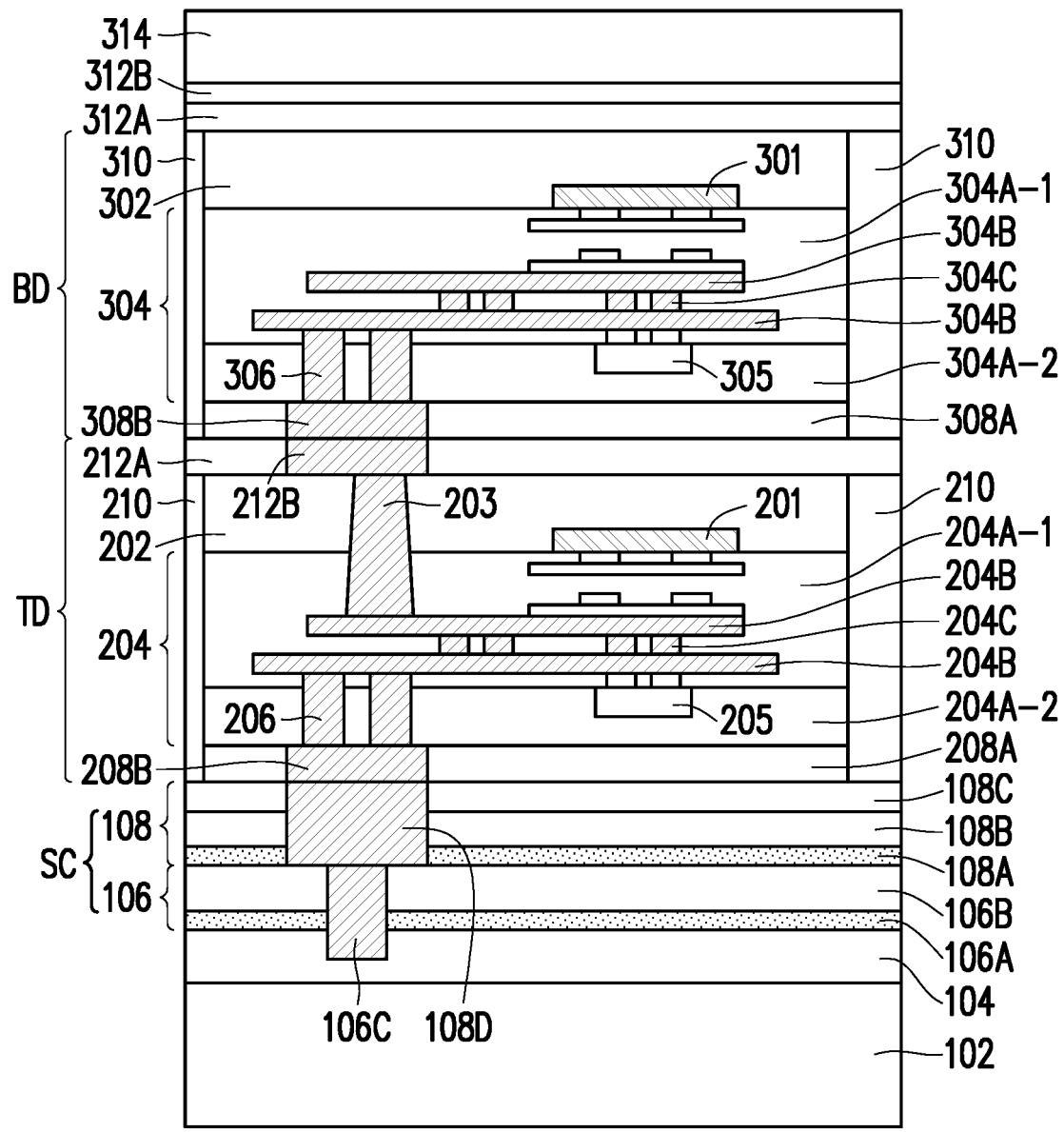

Referring to FIG. 2K, after stacking the base die BD over the top die TD, a gap filling material 310 is formed over the top die TD to surround the base semiconductor substrate 302 and the base interconnection layer 304. For example, the gap filling material 310 fill up the gaps so that sidewalls of the gap filling material 310 is aligned with sidewalls of the top die TD and the sacrificial layer SC. In some embodiments, the gap filling material 310 is a gap filling oxide material. However, the disclosure is not limited thereto. In some embodiments, after forming the gap filling material 310, a planarization process is performed so that top surfaces of the gap filling material 310 and the base semiconductor substrate 302 are aligned and coplanar with one another. In the exemplary embodiment, the gap filling material 310 is formed to complete the formation of the base die BD. In other words, the gap filling material 310 also constitute part of the base die BD.

After forming the gap filling material 310, a bonding film 312A is formed on the base semiconductor substrate 302 and over the gap filling material 310 of the base die BD. In some embodiments, the bonding film 312A is further bonded to a support structure 314 (such as a silicon support) through another bonding film 312B that is attached to the support structure 314. In other words, the stacked dies (top die TD and base die BD) is bonded to the support structure 314 through wafer-on-wafer bonding using the bonding films 312A and 312B.

Figure 2L:
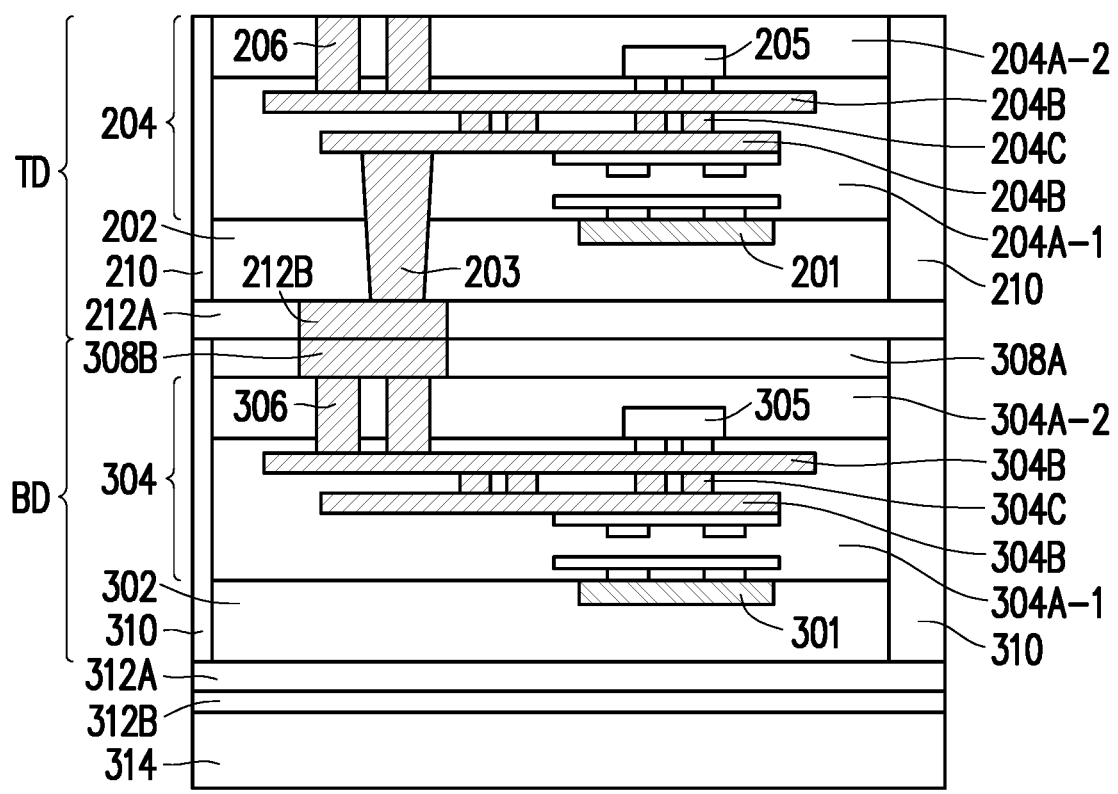

Referring to step S20 in FIG. 1 and as illustrated in FIG. 2L, in a next step, the structure illustrated in FIG. 2L is flipped around (e.g. mounted onto a tape supported by a frame), and a removal process is performed to remove the carrier substrate 102, the conductive material layer 104 and at least portions of the sacrificial layer SC. In the exemplary embodiment, the sacrificial layer SC is completely removed, and the top grounding layer 208 is further removed to reveal the top interconnection layer 204 of the top die TD. In some embodiments, top surfaces of the top grounding vias 206 are revealed after the removal process.

Figure 2M:
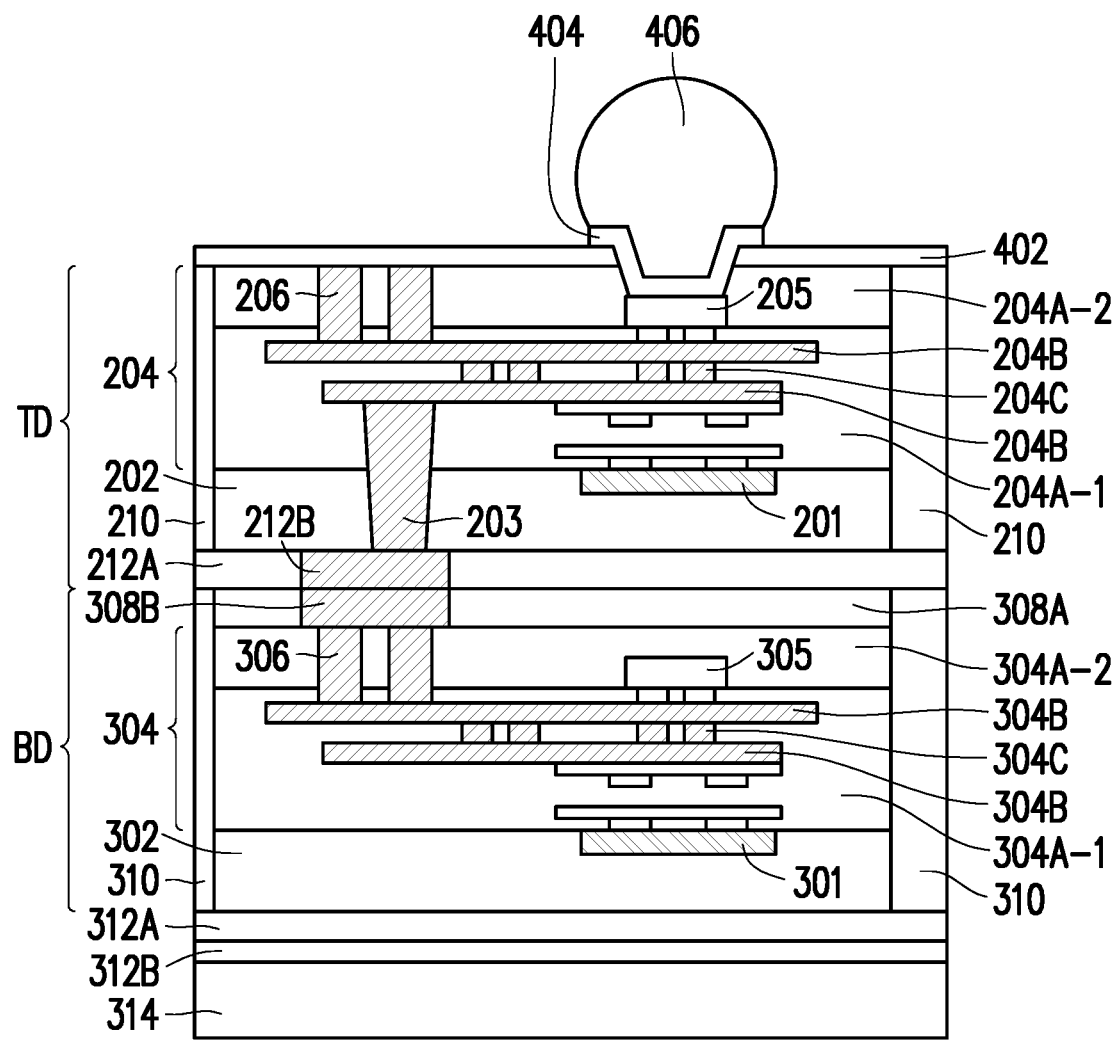

Referring to FIG. 2M, after the removal process, a passivation layer 402 is formed over the top interconnection layer 204 to cover up the top grounding vias 206. In some embodiments, the passivation layer 402 is patterned to form an opening (not shown) that reveals the top conductive pads 205 of the top die TD. Subsequently, a bump pad 404 is disposed on the passivation layer 402 within the opening, wherein the bump pad 404 is physically connected to the top conductive pads 205. In some embodiments, the bump pad 404 is for example, under-ball metallurgy (UBM) patterns used for ball mount. In some embodiments, the materials of the bump pad 404 may include copper, nickel, titanium, tungsten, or alloys thereof or the like, and may be formed by an electroplating process, for example.

Referring to step S22 in FIG. 1 and as illustrated in FIG. 2M, after forming the bump pad 404, at least one conductive terminal 406 is disposed on the bump pad 404, wherein the conductive terminal 406 is electrically connected to the top conductive pad 205 through the bump pad 404. In some embodiments, the conductive terminal 406 is disposed on the bump pad 404 by a ball placement process or reflow process. In some embodiments, the conductive terminal 406 is solder balls or ball grid array (BGA) balls. In some embodiments, the conductive terminal 406 is, for example, controlled collapse chip connection (C4) bumps or microbumps. The disclosure is not limited thereto.

Referring to FIG. 2M, only one bump pad 404 and one conductive terminal 406 are shown for simplification. However, it should be noted that a plurality of bump pads 404 and a plurality of conductive terminals 406 may exist. In some embodiments, the number of bump pads 404 and conductive terminals 406 may correspond to the number of top conductive pads 205. In the exemplary embodiment, since the top grounding vias 206 are covered up by the passivation layer 402, the top grounding vias 206 are dummy vias. Up to here, a stacked die structure SD1 according to some embodiments of the present disclosure is accomplished.

Figure 3:
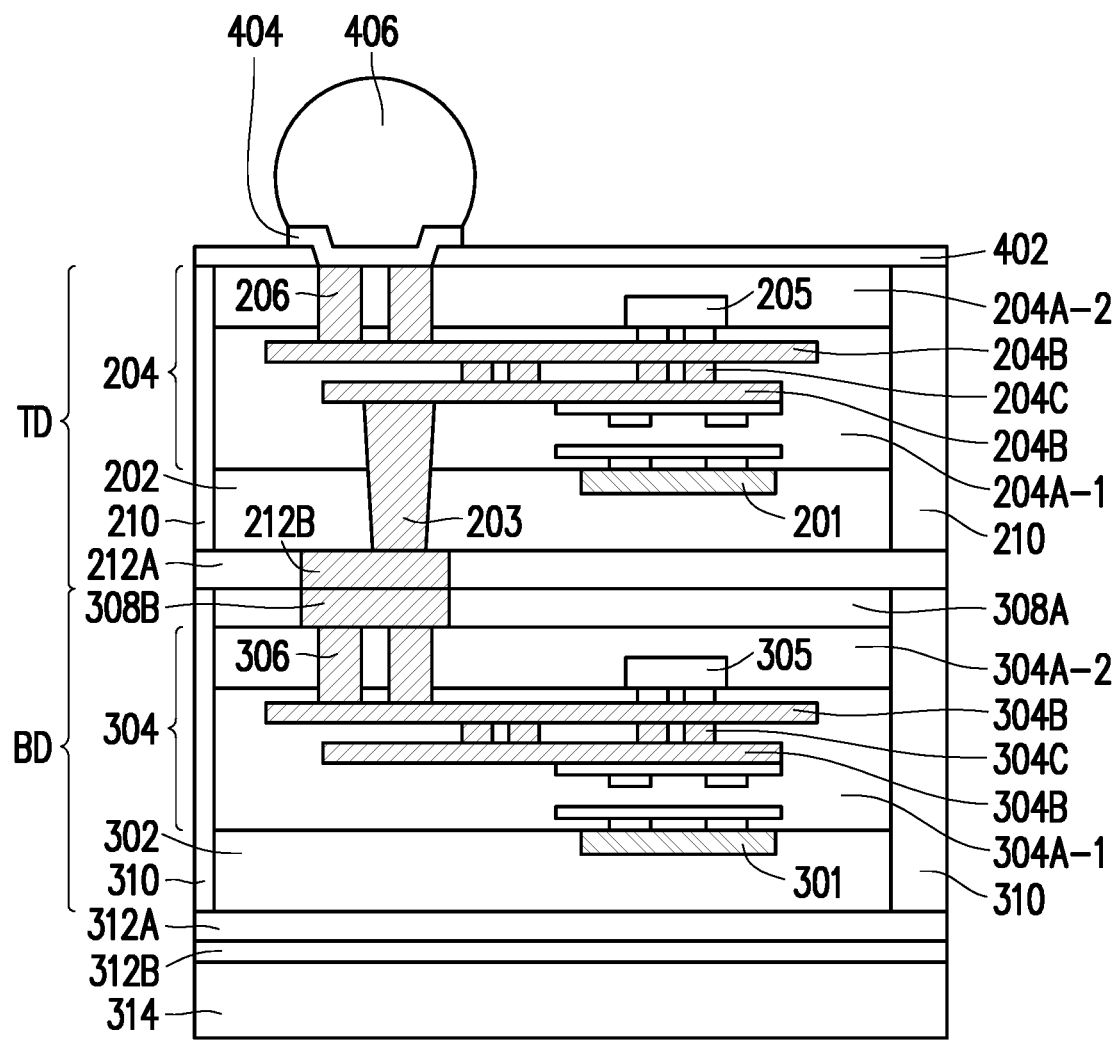
FIG. 3 is a schematic sectional view of a stacked die structure according to some other exemplary embodiments of the present disclosure.

FIG. 3 is a schematic sectional view of a stacked die structure SD2 according to some other exemplary embodiments of the present disclosure. The stacked die structure SD2 shown in FIG. 3 is similar to the stacked die structure SD1 shown in FIG. 2M. Therefore, the same reference numerals are used to refer to the same or liked parts, and its detailed description will be omitted herein. The difference between the stacked die structures SD1 and SD2 is the positions of the bump pad 404 and conductive terminal 406.

As illustrated in FIG. 3, the passivation layer 402 is formed over the top interconnection layer 204 of the top die TD. In some embodiments, the passivation layer 402 is patterned to form an opening (not shown) that reveal a top surface of the top grounding vias 206. Subsequently, a bump pad 404 is disposed on the passivation layer 402 within the opening, wherein the bump pad 404 is physically connected to the top grounding vias 206. After forming the bump pad 404, a conductive terminal 406 is disposed on the bump pad 404 within the opening, wherein the conductive terminal 406 is electrically connected to the top grounding vias 206 through the bump pad 404.

Figure 4:
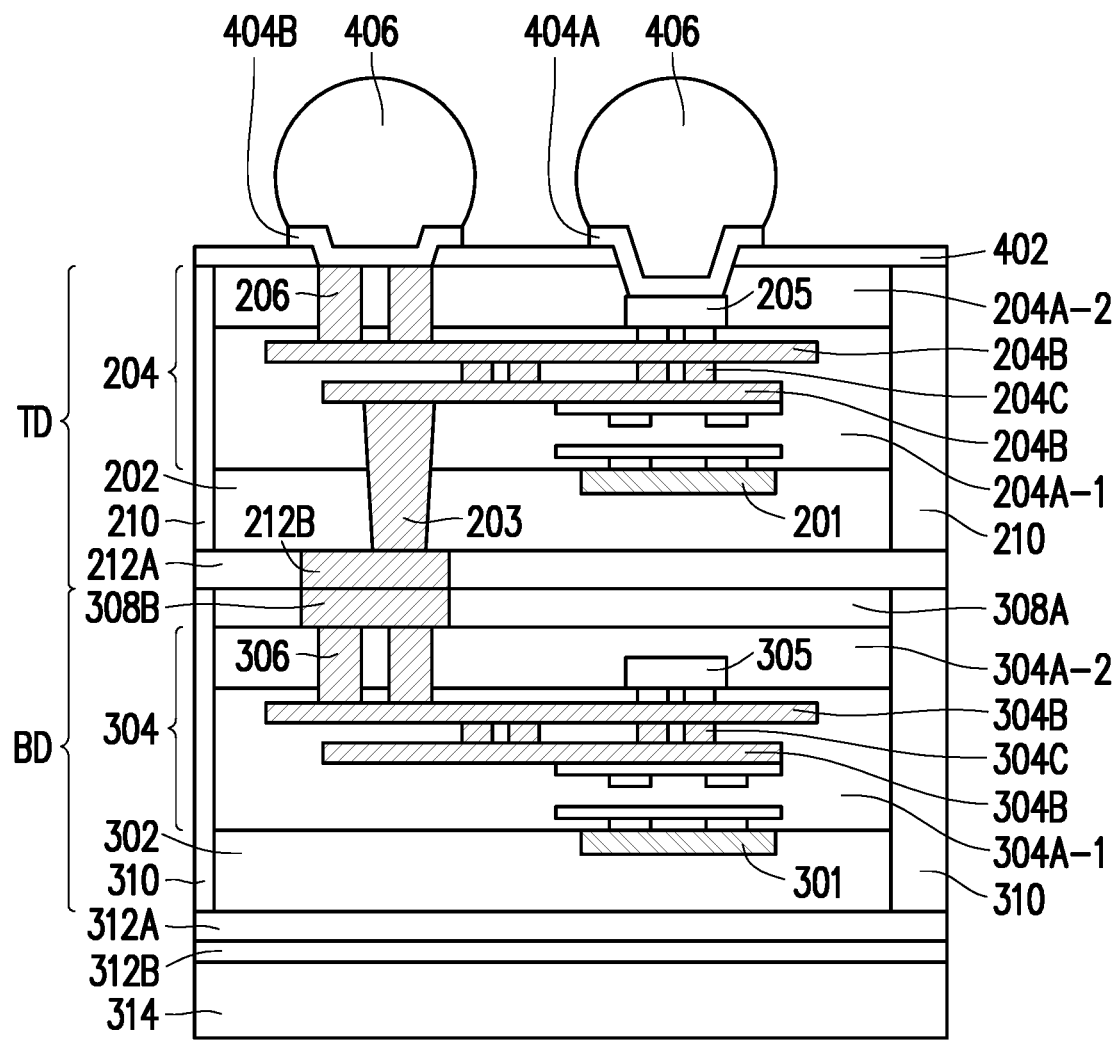
FIG. 4 is a schematic sectional view of a stacked die structure according to some other exemplary embodiments of the present disclosure.

FIG. 4 is a schematic sectional view of a stacked die structure SD3 according to some other exemplary embodiments of the present disclosure. The stacked die structure SD3 shown in FIG. 4 is similar to the stacked die structure SD1 shown in FIG. 2M. Therefore, the same reference numerals are used to refer to the same or liked parts, and its detailed description will be omitted herein. The difference between the stacked die structures SD1 and SD3 is the positions of the bump pads 404 and conductive terminals 406.

As illustrated in FIG. 4, the passivation layer 402 is formed over the top interconnection layer 204 of the top die TD. In some embodiments, the passivation layer 402 is patterned to form an opening (e.g. first opening) that reveals the conductive pads 205 of the top die TD. In certain embodiments, the passivation layer 402 is further patterned to form a second opening (not shown) that reveals the top grounding vias 206. Subsequently, a bump pad 404A is disposed on the passivation layer 402 within the opening to be physically connected to the conductive pads 205, while a bump pad 404B is disposed on the passivation layer 402 within the second opening to be physically connected to the top grounding vias 206. In the exemplary embodiment, since the bump pad 404A and the bump pad 404B are electrically connected to different components, a profile of the bump pad 404A is different from a profile of the bump pad 404B. After forming the bump pads 404A and 404B, conductive terminals 406 are respectively disposed thereon. In some embodiments, the conductive terminals 406 are electrically connected to the top conductive pad 205 through the bump pad 404A, or electrically connected to the top grounding vias 206 through the bump pad 404B.

Figure 5A:
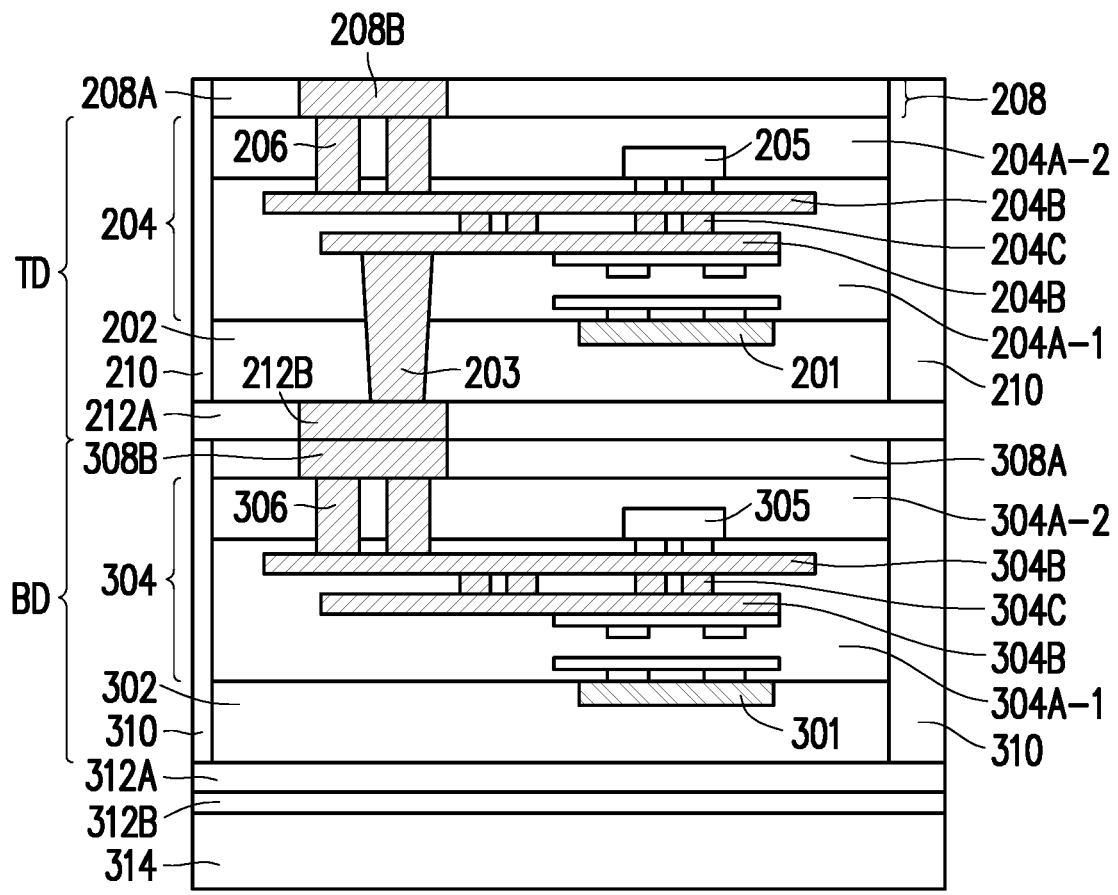
FIG. 5A and FIG. 5B are schematic sectional views of various stages in a method of fabricating a stacked die structure according to some other exemplary embodiments of the present disclosure.
Figure 5B:
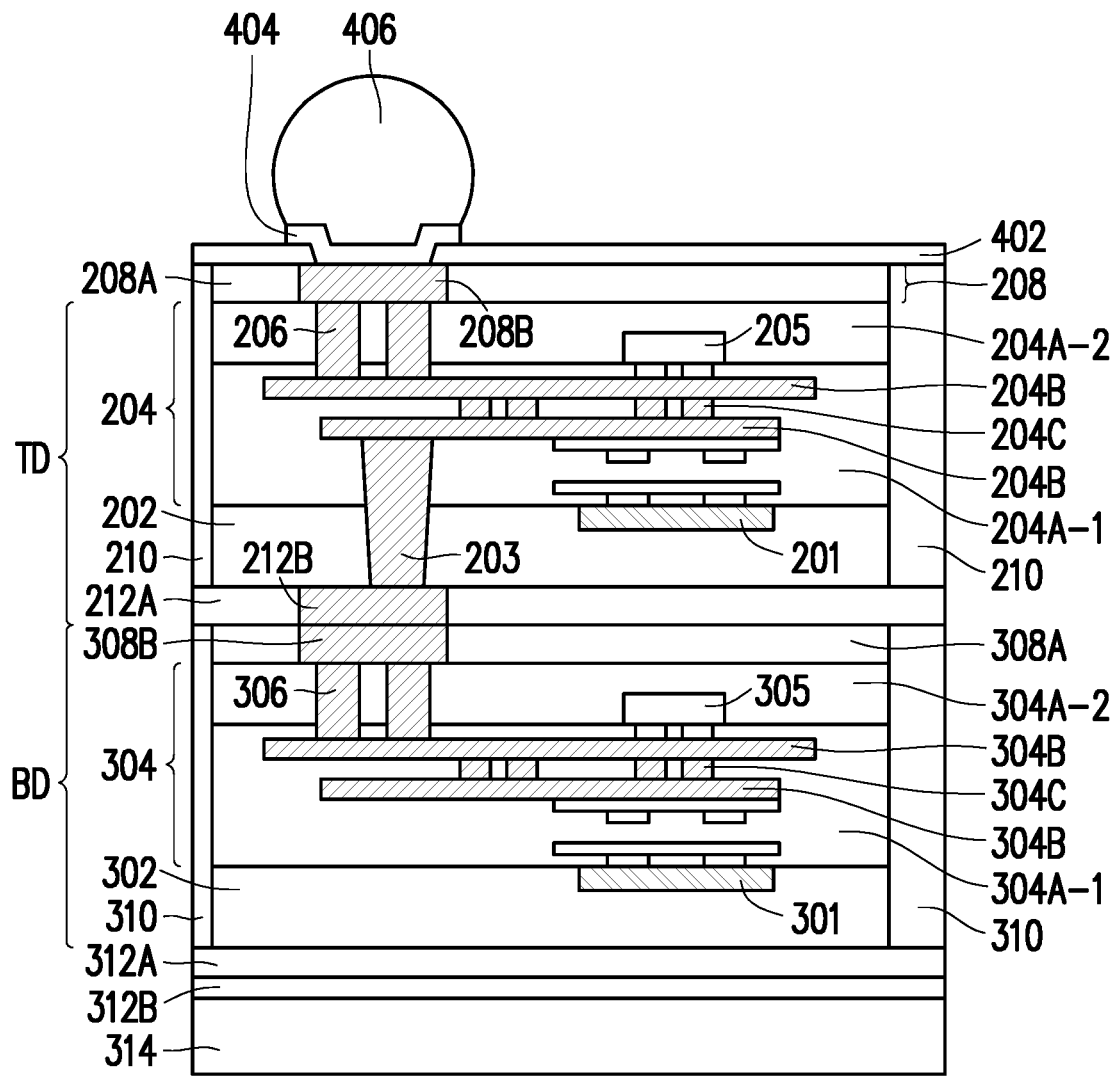

FIG. 5A and FIG. 5B are schematic sectional views of various stages in a method of fabricating a stacked die structure according to some other exemplary embodiments of the present disclosure. The method shown in FIG. 5A to FIG. 5B is similar to the method shown in FIG. 2A to FIG. 2M. Therefore, the same reference numerals are used to refer to the same or liked parts, and its detailed description will be omitted herein. The difference between the embodiments is in the removal process, and the position of the bump pads and conductive terminals.

Referring to FIG. 5A, after bonding the stacked dies (top die TD and base die BD) to the support structure 314 as shown in FIG. 2K, a removal process is performed to remove the carrier substrate 102, the conductive material layer 104 and at least portions of the sacrificial layer SC. As illustrated in FIG. 5A, the sacrificial layer SC is completely removed during the removal process to reveal the top grounding layer 208 of the top die TD. In some embodiments, the ground pad 208B of the top grounding layer 208 is revealed after the removal process.

Referring to FIG. 5B, after the removal process, a passivation layer 402 is formed over the top grounding layer 208 of the top die TD. In some embodiments, the passivation layer 402 is patterned to form an opening (not shown) that reveals the ground pad 208B of the top die TD. Subsequently, a bump pad 404 is disposed on the passivation layer 402 within the opening, wherein the bump pad 404 is physically connected to the ground pad 208B. After forming the bump pad 404, a conductive terminal 406 is disposed on the bump pad 404, wherein the conductive terminal 406 is electrically connected to the ground pad 208B through the bump pad 404. Up to here, a stacked die structure SD4 according to some embodiments of the present disclosure is accomplished.

Figure 6A:
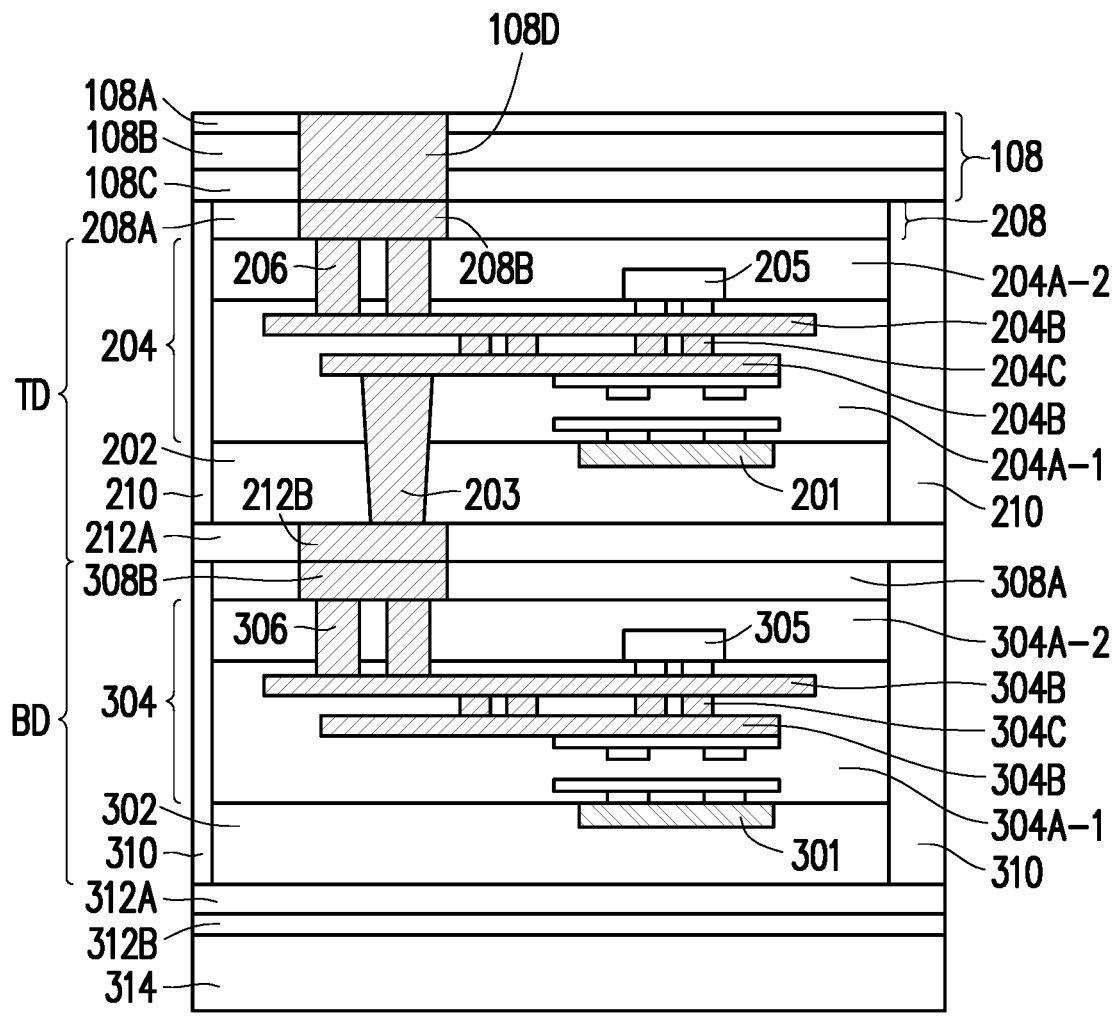
FIG. 6A and FIG. 6B are schematic sectional views of various stages in a method of fabricating a stacked die structure according to some other exemplary embodiments of the present disclosure.
Figure 6B:
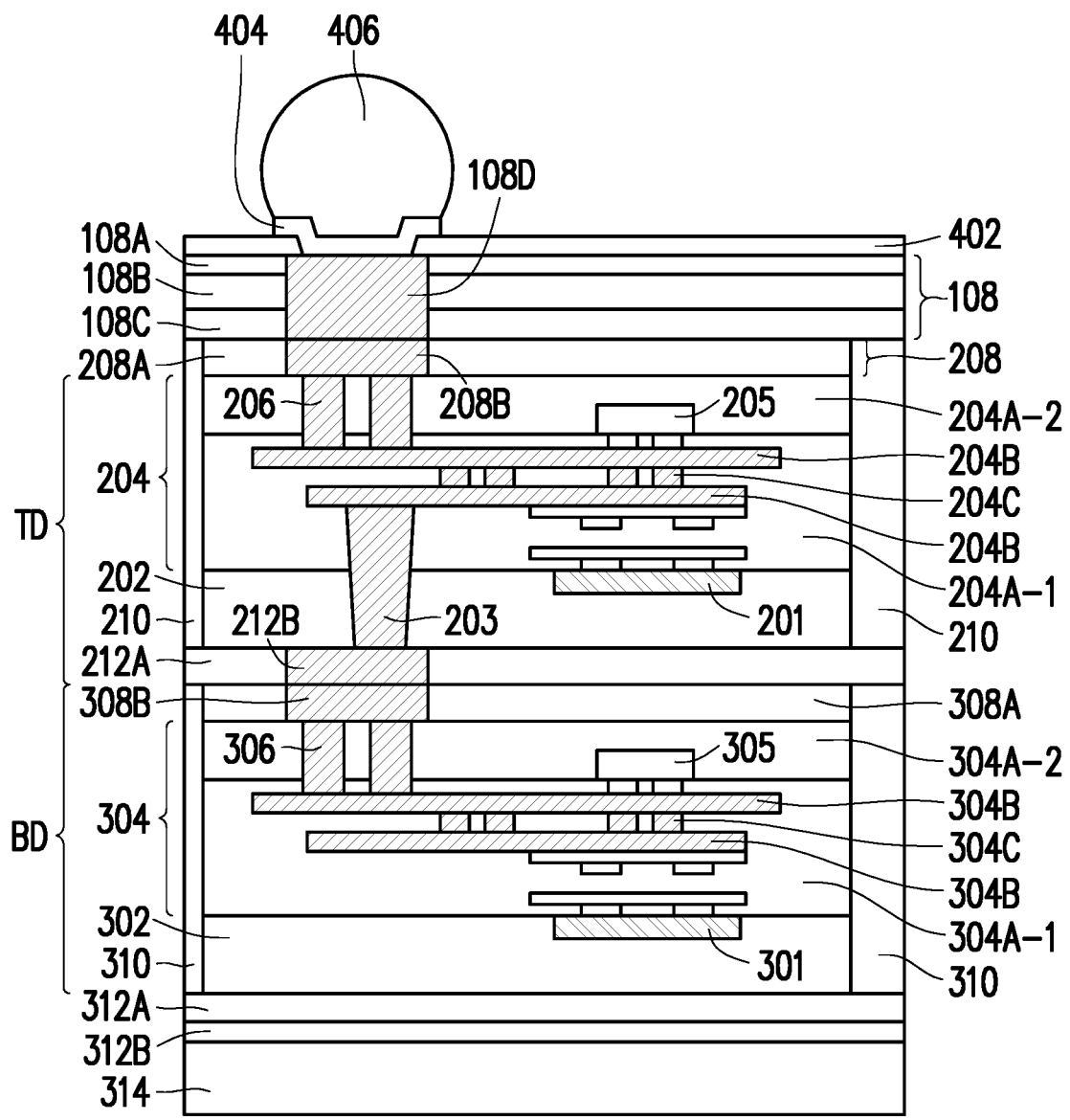

FIG. 6A and FIG. 6B are schematic sectional views of various stages in a method of fabricating a stacked die structure according to some other exemplary embodiments of the present disclosure. The method shown in FIG. 6A to FIG. 6B is similar to the method shown in FIG. 2A to FIG. 2M. Therefore, the same reference numerals are used to refer to the same or liked parts, and its detailed description will be omitted herein. The difference between the embodiments is in the removal process, and the position of the bump pads and conductive terminals.

Referring to FIG. 6A, after bonding the stacked dies (top die TD and base die BD) to the support structure 314 as shown in FIG. 2K, a removal process is performed to remove the carrier substrate 102, the conductive material layer 104 and at least portions of the sacrificial layer SC. As illustrated in FIG. 6A, the carrier contact-layer 106 of the sacrificial layer SC is removed during the removal process, while the carrier bonding-layer 108 is retained. For example, in some embodiments, the carrier bonding-pad 108D is revealed after the removal process.

Referring to FIG. 6B, after the removal process, a passivation layer 402 is formed over the carrier bonding-layer 108, or over the etch stop layer 108A of the carrier bonding-layer 108. In some embodiments, the passivation layer 402 is patterned to form an opening (not shown) that reveals the carrier bonding-pad 108D of the carrier bonding-layer 108. Subsequently, a bump pad 404 is disposed on the passivation layer 402 within the opening, wherein the bump pad 404 is physically connected to the carrier bonding-pad 108D. After forming the bump pad 404, a conductive terminal 406 is disposed on the bump pad 404, wherein the conductive terminal 406 is electrically connected to the carrier bonding-pad 108D through the bump pad 404. Up to here, a stacked die structure SD5 according to some embodiments of the present disclosure is accomplished.

Figure 7A:
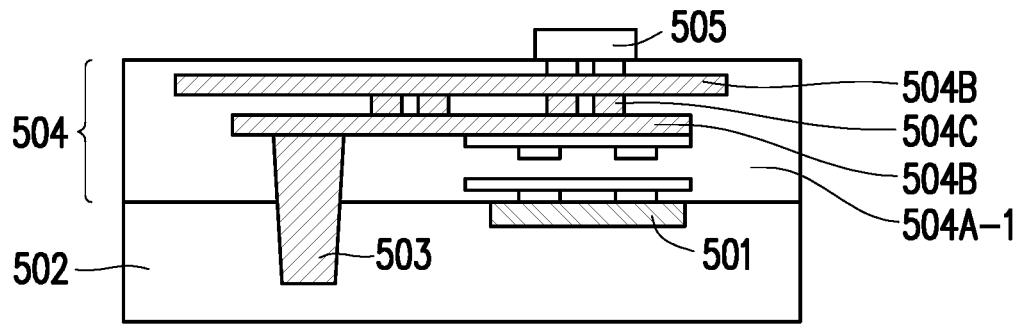
FIG. 7A and FIG. 7G are schematic sectional views of various stages in a method of fabricating a stacked die structure according to some other exemplary embodiments of the present disclosure.
Figure 7B:
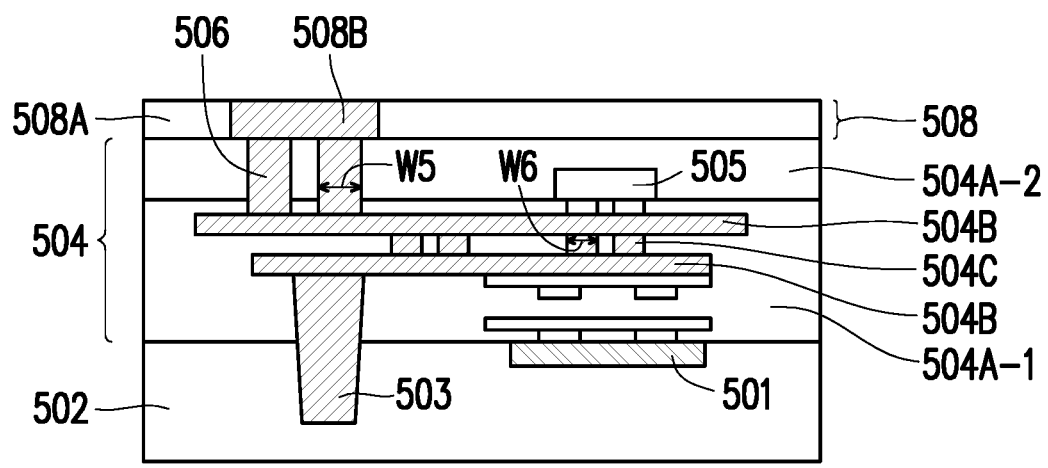
Figure 7C:
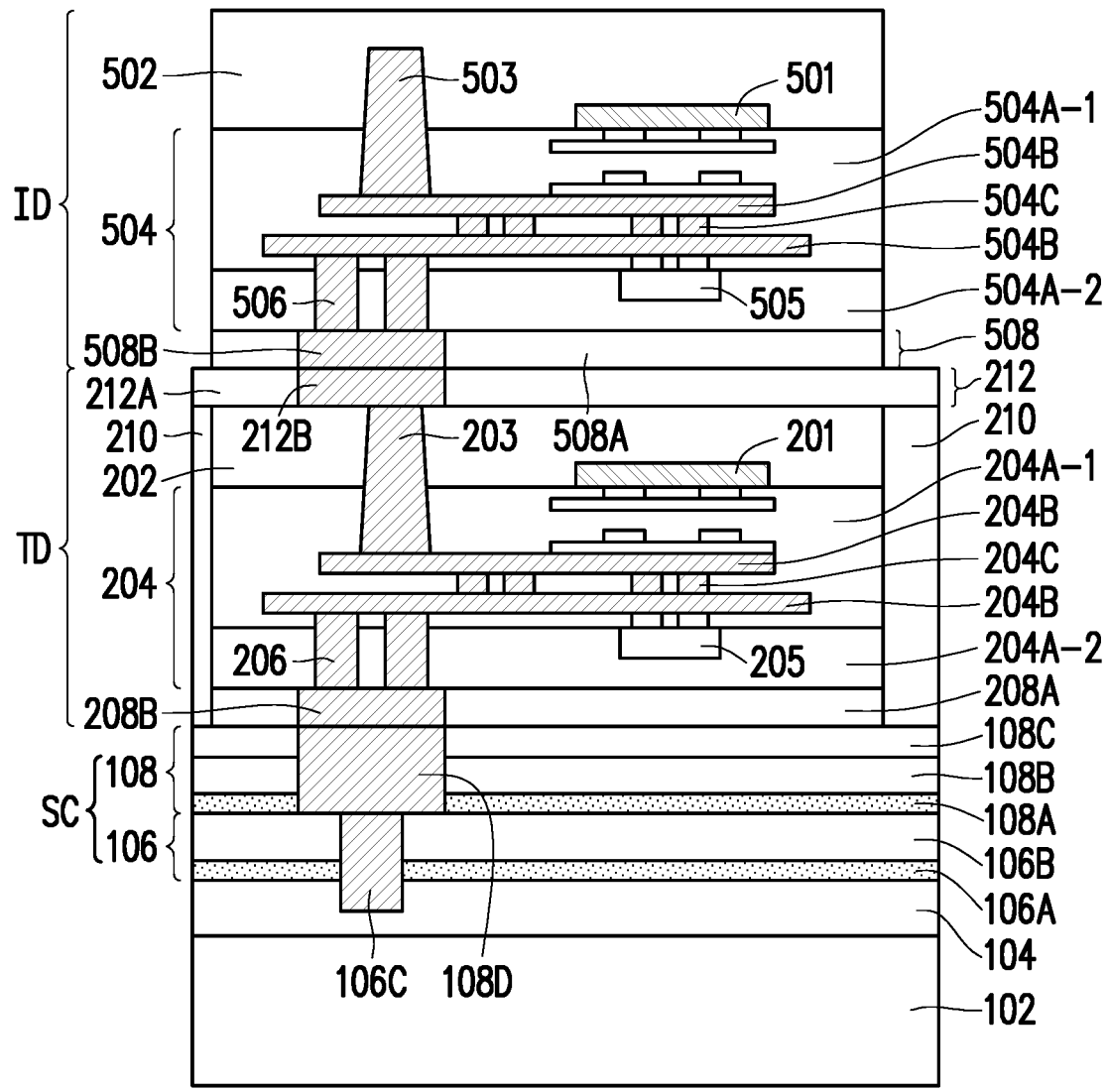
Figure 7D:
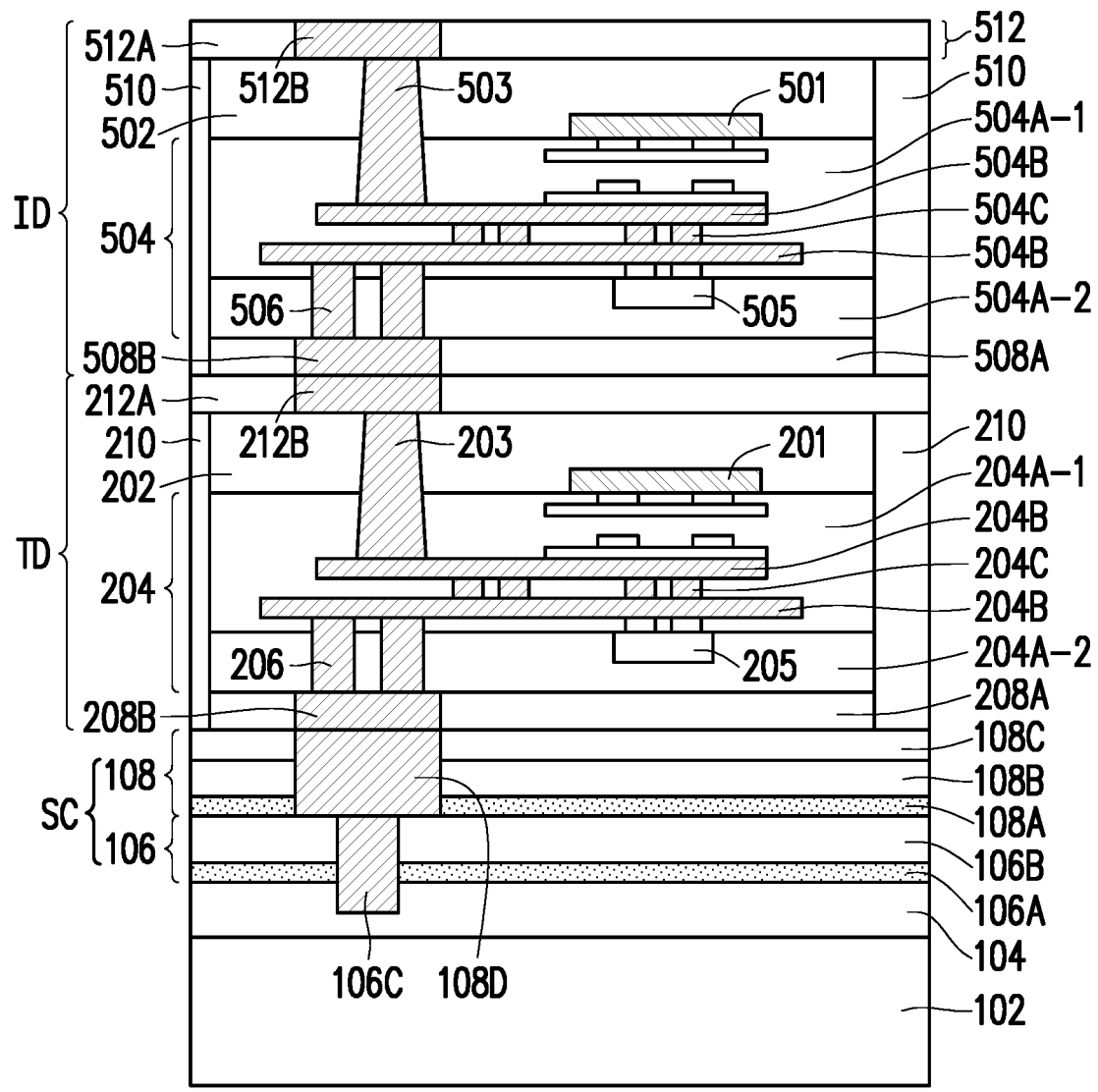
Figure 7E:
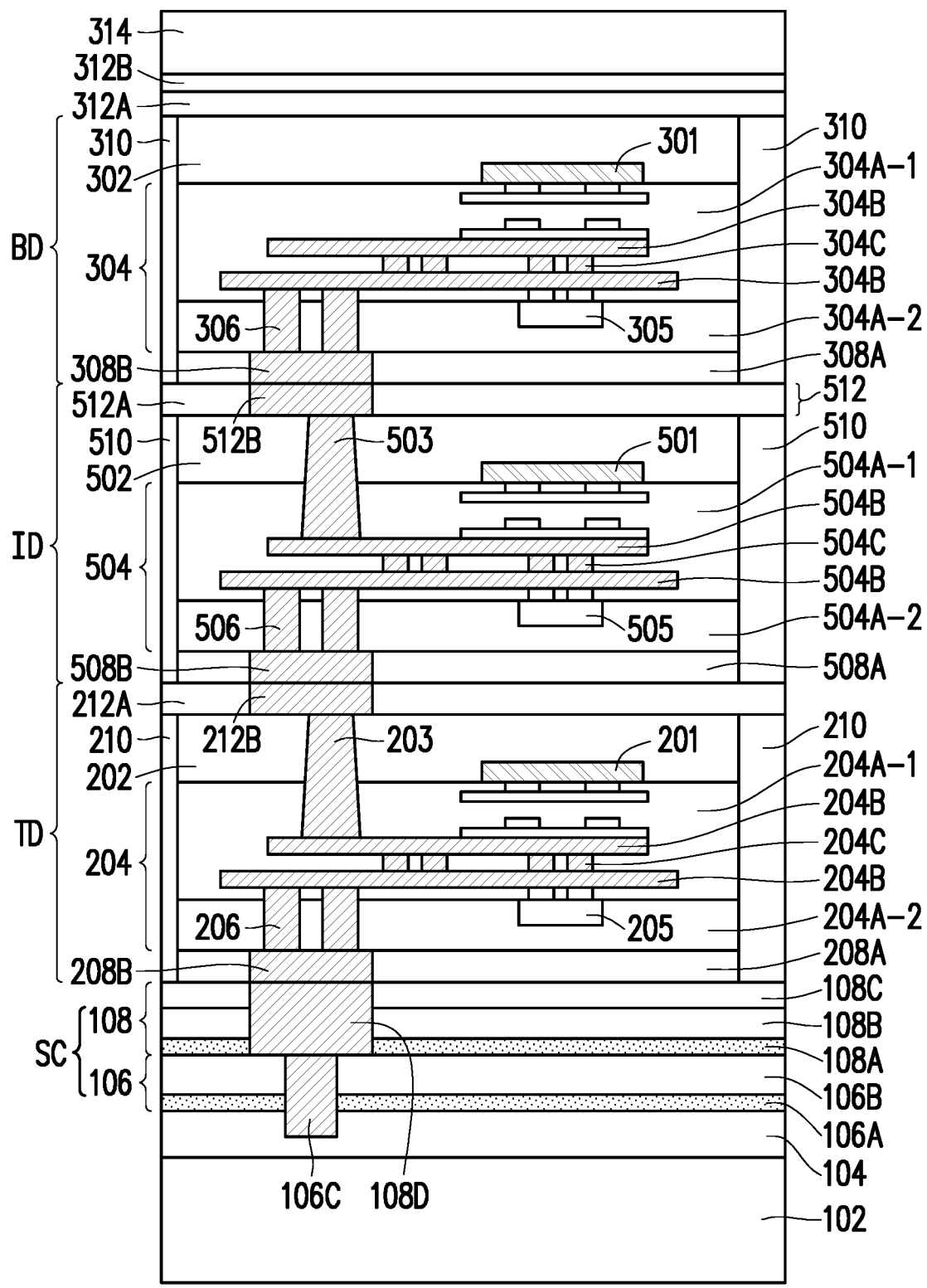
Figure 7F:
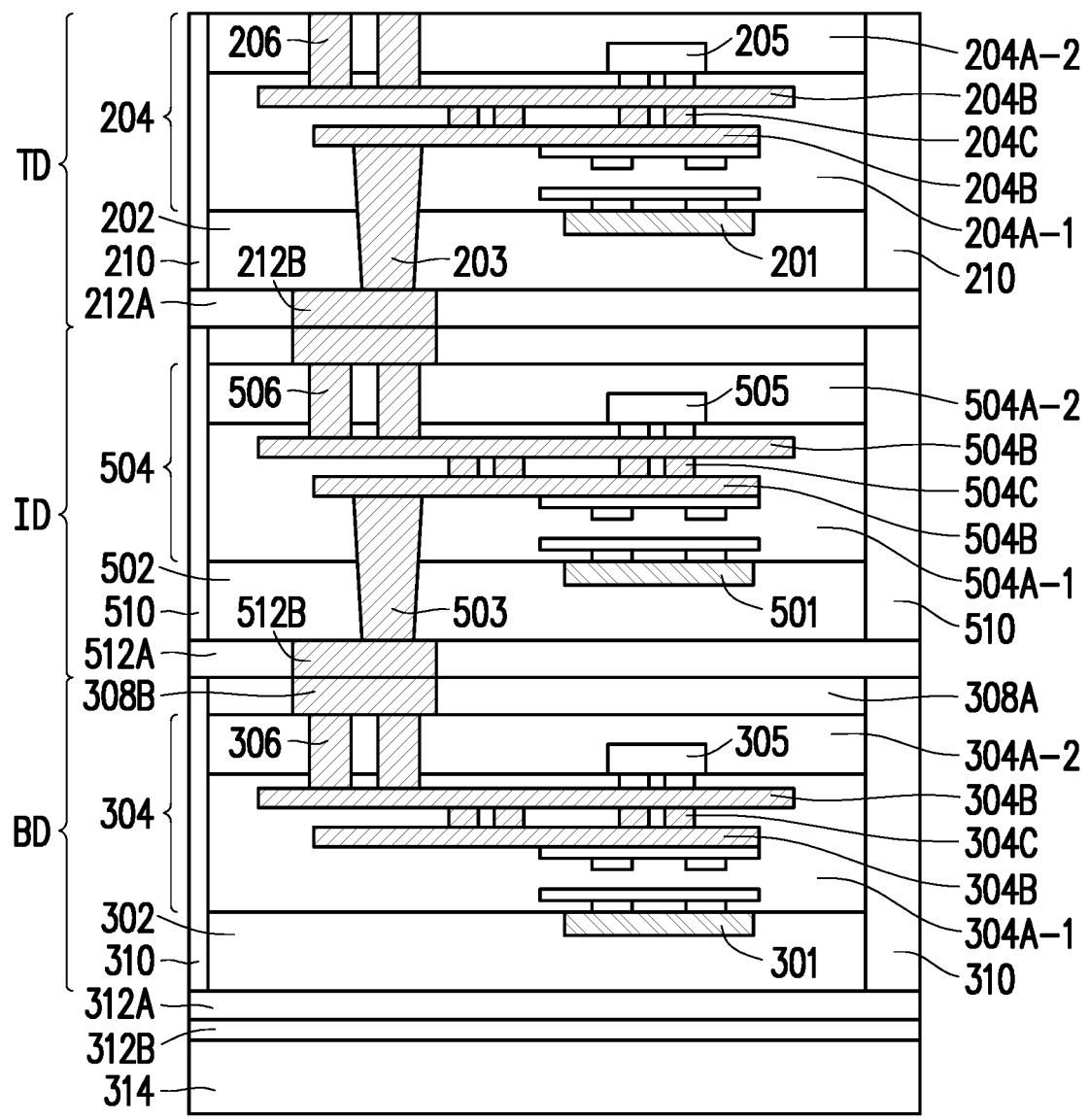
Figure 7G:
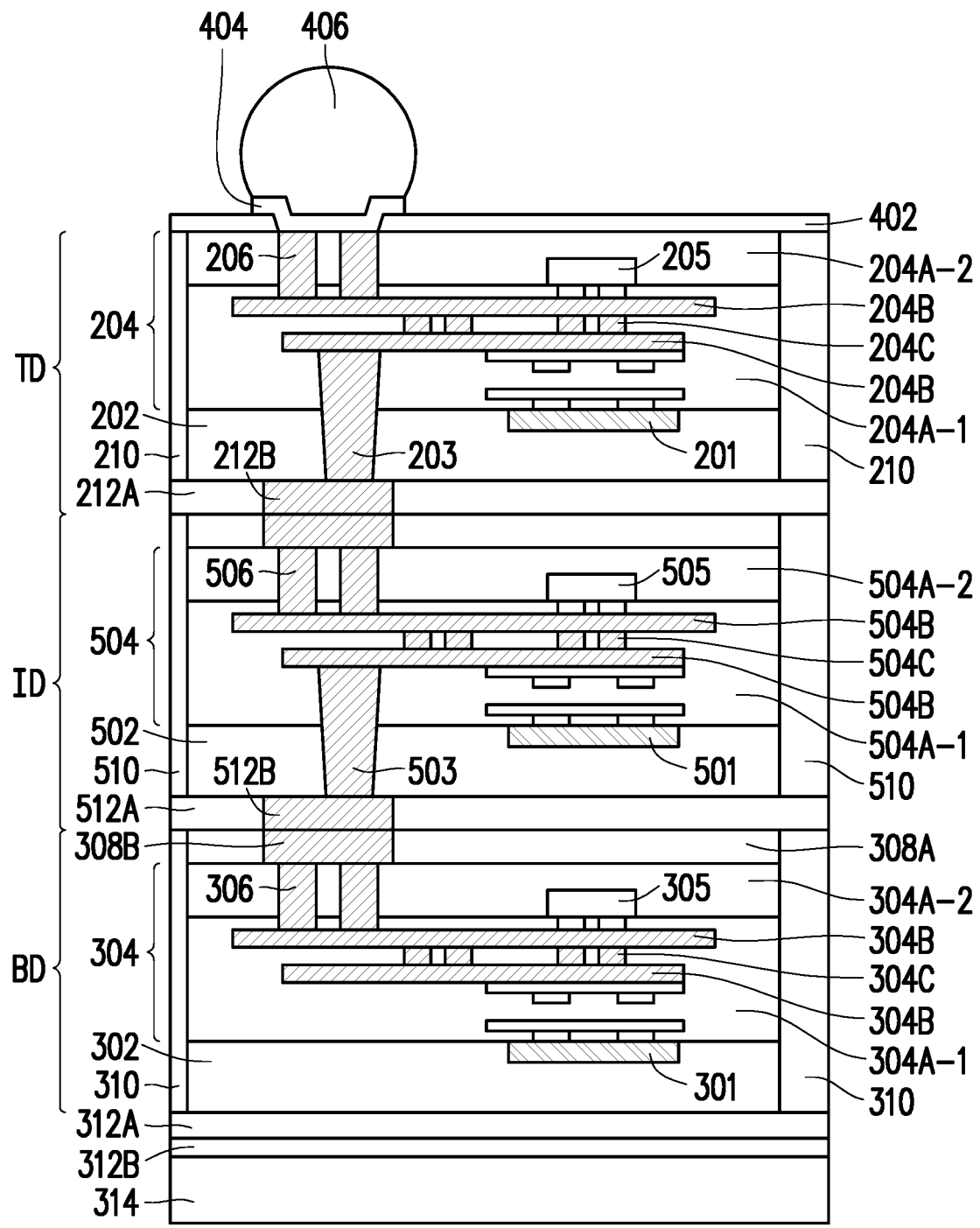

FIG. 7A and FIG. 7G are schematic sectional views of various stages in a method of fabricating a stacked die structure according to some other exemplary embodiments of the present disclosure. The method shown in FIG. 7A to FIG. 7G is similar to the method shown in FIG. 2A to FIG. 2M. Therefore, the same reference numerals are used to refer to the same or liked parts, and its detailed description will be omitted herein. The difference between the embodiments is in the position of the bump pads and conductive terminals, and that an intermediate die is further provided.

Referring to FIG. 7A, the steps of forming an intermediate die ID will first be described. As illustrated in FIG. 7A, an intermediate die ID having an intermediate semiconductor substrate 502 and an intermediate interconnection layer 504 is provided. In some embodiments, the intermediate semiconductor substrate 502 may be a bulk silicon substrate or a silicon-on-insulator (SOI) substrate, and further includes device 501 formed therein. For example, the device 501 may be active components (e.g., transistors or the like) and/or passive components (e.g., resistors, capacitors, inductors or the like) that are formed and embedded within the intermediate semiconductor substrate 502.

In some embodiments, the intermediate interconnection layer 504 is formed on the intermediate semiconductor substrate 502 and includes a first dielectric layer 504A-1, a plurality of conductive layers 504B embedded in the first dielectric layer 504A-1, and a plurality of conductive vias 504C joining the plurality of conductive layers 504B. In some embodiments, a through substrate via 503 is formed to be electrically connected to the conductive layers 504B. In certain embodiments, the through substrate via 503 is embedded within the intermediate semiconductor substrate 502 and the intermediate interconnection layer 504. Furthermore, at least one intermediate conductive pad 505 is disposed on the intermediate interconnection layer 504 and electrically connected to the conductive layers 504B of the intermediate interconnection layer 504. In the exemplary embodiment, the number of intermediate conductive pads 505 located on the intermediate interconnection layer 504 may be selected based on design requirement. In some embodiments, the intermediate conductive pads 505 may be aluminum pads, copper pads or other suitable metal pads.

Referring to FIG. 7B, in a next step, a second dielectric layer 504A-2 is formed over the first dielectric layer 504A-1 and to cover the intermediate conductive pads 505. In the exemplary embodiment, the first dielectric layer 504A-1 and the second dielectric layer 504A-2 together constitute the dielectric layer of the intermediate interconnection layer 504. The first dielectric layer 504A-1 and the second dielectric layer 504A-2 may be a silicon oxide layer, a silicon nitride layer, a silicon oxy-nitride layer or a dielectric layer formed of any suitable dielectric material. In some embodiments, intermediate vias 506 are formed in the second dielectric layer 504A-2. In certain embodiments, after planarization of the second dielectric layer 504A-2 and the intermediate vias 506, a bonding film 508A is formed over the second dielectric layer 504A-2 by deposition. In some embodiments, after forming the bonding film 508A, an intermediate bonding pad 508B is formed within the bonding film 508A and patterned using a photolithography and/or etching process.

In the exemplary embodiment, the intermediate vias 506 are formed to be embedded in the intermediate interconnection layer 504. For example, the intermediate vias 506 are surrounded by the second dielectric layer 504A-2 and the first dielectric layer 504A-1. In some embodiments, the intermediate vias 506 are located adjacent to the intermediate conductive pad 505, wherein the intermediate vias 506 and the intermediate conductive pads 505 are connected to the same conductive layer 504B. In some embodiments, a width W5 of the intermediate vias 506 is greater than a width W6 of the plurality of conductive vias 504C. In certain embodiments, a ratio of the width W5 to the width W6 (W5:W6) is in a range of 4:1 to 6:1.

In some embodiments, the intermediate bonding pad 508B is formed over the second dielectric layer 504A-2 and physically connected to the intermediate vias 506. In some embodiments, the intermediate bonding pad 508B is surrounded by the bonding film 508A. In certain embodiments, a planarization process (such as chemical mechanical polishing (CMP)) may be performed so that a top surface of the intermediate bonding pad 508B is aligned with a top surface of the bonding film 508A. The bonding film 508A and the intermediate bonding pad 508B together constitute an intermediate bonding layer 508. For example, the intermediate bonding layer 508 is located on and electrically connected to the intermediate interconnection layer 504, wherein side surfaces of the intermediate bonding layer 508 and the intermediate interconnection layer 504 are aligned or coplanar with one another.

Referring to FIG. 7C, in a subsequent step, the intermediate die ID obtained in FIG. 7B is stacked on the top die TD and over the sacrificial layer SC illustrated in FIG. 2G. In some embodiments, the intermediate die ID is stacked on the top die TD by joining the intermediate bonding layer 508 of the intermediate die ID to the top bonding layer 212 of the top die TD through hybrid bonding. For example, the intermediate bonding pad 508B is physically joined with the top bonding pad 212B through hybrid bonding. In some embodiments, the intermediate die ID is electrically grounded to the carrier substrate 102 through the top die TD, the sacrificial layer SC and the conductive material layer 104.

Referring to FIG. 7D, after stacking the intermediate die ID over the top die TD, a gap filling material 510 is formed over the top die TD to surround the intermediate semiconductor substrate 502 and the intermediate interconnection layer 504. For example, the gap filling material 510 fill up the gaps so that sidewalls of the gap filling material 510 is aligned with sidewalls of the top die TD and the sacrificial layer SC. In some embodiments, the gap filling material 510 is a gap filling oxide material. However, the disclosure is not limited thereto.

In some embodiments, after forming the gap filling material 510, a planarization process is performed to thin down the intermediate semiconductor substrate 502 and to reveal the through substrate via 503. Thereafter, an intermediate bonding layer 512 including a bonding pad 512B embedded in a dielectric layer 512A is formed over the thinned intermediate semiconductor substrate 502 through photolithography and/or etching processes. In some embodiments, the bonding pad 512B is electrically connected to the through substrate via 503. In certain embodiments, another planarization process (such as chemical mechanical polishing (CMP)) may be performed so that a top surface of the bonding pad 512B is aligned with a top surface of the dielectric layer 512A. In the exemplary embodiment, the gap filling material 510 and the intermediate bonding layer 512 are formed to complete the formation of the intermediate die ID. In other words, the gap filling material 510 and the intermediate bonding layer 512 also constitute part of the intermediate die ID.

Referring to FIG. 7E, after stacking the intermediate die ID over the top die TD, the same steps described in FIG. 2H to FIG. 2K may be performed to stack a base die BD over the intermediate die ID, and wherein the stacked dies (top die TD, intermediate die ID and base die BD) are further bonded to the support structure 314 using bonding films 312A and 312B. In the exemplary embodiment, although only one intermediate die ID is shown to be located between the top die TD and the base die BD, however, the disclosure is not limited thereto. In alternative embodiments, a plurality of intermediate dies ID may be sequentially stacked over the top die TD, and being located in between the top die TD and the base die BD. In one exemplary embodiment, there are five intermediate dies ID located in between the top die TD and the base die BD.

Referring to FIG. 7F, in a next step, the structure illustrated in FIG. 7E is flipped around (e.g. mounted onto a tape supported by a frame), and a removal process is performed to remove the carrier substrate 102, the conductive material layer 104 and at least portions of the sacrificial layer SC. In the exemplary embodiment, the sacrificial layer SC is completely removed, and the top grounding layer 208 is further removed to reveal the top interconnection layer 204 of the top die TD. In some embodiments, top surfaces of the top grounding vias 206 are revealed after the removal process.

Referring to FIG. 7G, after the removal process, a passivation layer 402 is formed over the top interconnection layer 204 of the top die TD. In some embodiments, the passivation layer 402 is patterned to form an opening (not shown) that reveal the top grounding vias 206. Subsequently, a bump pad 404 is disposed on the passivation layer 402 within the opening, wherein the bump pad 404 is physically connected to the top grounding vias 206. After forming the bump pad 404, a conductive terminal 406 is disposed on the bump pad 404, wherein the conductive terminal 406 is electrically connected to the top grounding vias 206 through the bump pad 404. Up to here, a stacked die structure SD6 according to some embodiments of the present disclosure is accomplished.

In the above-mentioned embodiments, during the fabrication of the stacked die structure, the interconnection structures and through substrate vias of the dies (top die, intermediate die etc.) are electrically grounded to the carrier substrate through grounding structures such as the grounding vias, the carrier bonding-pad and the contact structure etc. As such, due to electrical grounding, a corrosion of the through vias or interconnect structures of the dies (top die, base die etc.) maybe prevented throughout the fabrication process. Overall, a problem of via corrosion observed in conventional fabrication processes may be resolved, and a device performance may be further improved.

In accordance with some embodiments of the present disclosure, a stacked die structure including a base die, a top die and a plurality of conductive terminals is provided. The base die includes a base semiconductor substrate, a base interconnection layer disposed on the base semiconductor substrate, and a base bonding layer disposed on and electrically connected to the base interconnection layer. The top die is stacked on the base die and electrically connected to the base die, wherein the top die includes a top bonding layer, a top semiconductor substrate, a top interconnection layer, top conductive pads and top grounding vias. The top semiconductor substrate is disposed on the top bonding layer. The top interconnection layer is disposed on the top semiconductor substrate, wherein the top interconnection layer comprises a dielectric layer, a plurality of conductive layers embedded in the dielectric layer, and a plurality of conductive vias joining the plurality of conductive layers. The top conductive pads and top grounding vias are embedded in the dielectric layer and disposed on the plurality of conductive layers. The plurality of conductive terminals is electrically connected to the top die.

In accordance with some other embodiments of the present disclosure, a method of fabricating a stacked die structure is described. The method includes the following steps. A doped carrier substrate is provided. A conductive material layer is formed on the doped carrier substrate. A sacrificial layer is formed to be disposed on and electrically connected to the conductive material layer. A top die is stacked on the sacrificial layer, wherein the top die is electrically grounded to the carrier substrate through the sacrificial layer and the conductive material layer. A base die is stacked on the top die, wherein the base die is electrically connected to the top die. A removal process is performed by removing the doped carrier substrate, the conductive material layer and at least portions of the sacrificial layer. A plurality of conductive terminals is disposed on and electrically connected to the top die.

In accordance with yet another embodiment of the present disclosure, a method of fabricating a stacked die structure is described. The method includes the following steps. A carrier substrate is provided. A carrier contact-layer is formed on the carrier substrate, wherein the carrier contact-layer comprises a contact structure that is electrically grounded to the carrier substrate. A carrier bonding-layer is formed on the carrier contact-layer, wherein the carrier bonding-layer comprises a carrier bonding-pad that is electrically connected to the contact structure. A top die is stacked on the carrier bonding-layer, wherein the top die includes a top semiconductor substrate, a top bonding layer, a top interconnection layer, top conductive pads, top grounding vias, and a top grounding layer. The top semiconductor substrate has a first surface and a second surface opposite to the first surface. The top bonding layer is disposed on the first surface of the top semiconductor substrate. The top interconnection layer is disposed on the second surface of the top semiconductor substrate, wherein the top interconnection layer includes a dielectric layer, a plurality of conductive layers embedded in the dielectric layer, and a plurality of conductive vias joining the plurality of conductive layers. The top conductive pads are embedded in the dielectric layer and disposed on the plurality of conductive layers. The top grounding vias are embedded in the dielectric layer and disposed on the plurality of conductive layers adjacent to the top conductive pads. The top grounding layer includes a ground pad connected to the top grounding vias, wherein the top die is stacked on the carrier bonding-layer by joining the ground pad to the carrier bonding-pad through hybrid bonding. A base die is stacked on the top die, wherein the base die comprises a base bonding layer that is hybrid bonded to the top bonding layer of the top die. The carrier substrate and the carrier contact layer are removed. A plurality of conductive terminals is formed to be electrically connected to the top die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked die structure, comprising:
   a base die comprising:
      a base semiconductor substrate;
      a base interconnection layer disposed on the base semiconductor substrate; and
      a base bonding layer disposed on and electrically connected to the base interconnection layer;
   a top die stacked on the base die and electrically connected to the base die, wherein the top die comprises:
      a top bonding layer hybrid bonded to the base bonding layer of the base die;
      a top semiconductor substrate disposed on the top bonding layer;
      a top interconnection layer disposed on the top semiconductor substrate, wherein the top interconnection layer comprises a dielectric layer, a plurality of conductive layers embedded in the dielectric layer, and a plurality of conductive vias joining the plurality of conductive layers; and
      top conductive pads and top grounding vias embedded in the dielectric layer and disposed on the plurality of conductive layers; and
   a plurality of conductive terminals electrically connected to the top die.

2. The stacked die structure according to claim 1, wherein a width of the top grounding vias is greater than a width of the plurality of conductive vias.

3. The stacked die structure according to claim 1, further comprising:
   a passivation layer, disposed on the top interconnection layer covering up the top grounding vias; and
   a plurality of bump pads, disposed on the passivation layer and physically connected to the top conductive pads, wherein the plurality of conductive terminals is disposed on the plurality of bump pads and electrically connected to the top conductive pads,
   wherein the top grounding vias are dummy vias.

4. The stacked die structure according to claim 1, further comprising:
   a passivation layer disposed on the top interconnection layer; and
   a plurality of bump pads, disposed on the passivation layer and physically connected to the top grounding vias, wherein the plurality of conductive terminals is disposed on the plurality of bump pads and electrically connected to the top grounding vias.

5. The stacked die structure according to claim 4, wherein the plurality of bump pads is disposed on the passivation layer is physically connected to the top conductive pads, and the plurality of conductive terminals is electrically connected to the top conductive pads.

6. The stacked die structure according to claim 1, further comprising:
   a top grounding layer disposed on the top interconnection layer, wherein the top grounding layer comprises a ground pad connected to at least one of the top grounding vias;
   a passivation layer disposed on the top grounding layer; and
   a plurality of bump pads, disposed on the passivation layer and physically connected to the ground pad, wherein the plurality of conductive terminals is disposed on the plurality of bump pads and electrically connected to the top grounding vias through the ground pad.

7. The stacked die structure according to claim 1, further comprising:
a top grounding layer disposed on the top interconnection layer, wherein the top grounding layer comprises a ground pad connected to at least one of the top grounding vias;
a carrier bonding-layer disposed on the top grounding layer, wherein the carrier bonding-layer comprises a carrier bonding-pad hybrid bonded to the ground pad;
a passivation layer disposed on the carrier bonding layer; and
a plurality of bump pads, disposed on the passivation layer and physically connected to the carrier bonding-pad, wherein the plurality of conductive terminals is disposed on the plurality of bump pads and electrically connected to the top grounding vias through the carrier bonding-pads.

8. A semiconductor structure, comprising:
a base die comprising a base bonding pad;
a top die stacked on top of the base die, wherein the top die comprises:
a top bonding pad physically joined with the base bonding pad;
a plurality of conductive layers and a plurality of conductive vias electrically connected to the top bonding pad;
top grounding vias disposed on the plurality of conductive layers, wherein a width of the top grounding vias is greater than a width of the plurality of conductive vias;
a top conductive pad disposed on the plurality of conductive layers at a same level with the top grounding vias; and
a dielectric layer surrounding and covering the top grounding vias and the top conductive pad.

9. The semiconductor structure according to claim 8, further comprising:
a passivation layer covering the dielectric layer;
a bump pad disposed on the passivation layer and electrically connected to the plurality of conductive layers; and
a conductive terminal disposed on the bump pad.

10. The semiconductor structure according to claim 9, wherein the bump pad is physically joined with the top conductive pad, and the passivation layer is covering and contacting top surfaces of the top grounding vias.

11. The semiconductor structure according to claim 9, wherein the bump pad is physically joined with the top grounding vias, and the passivation layer is covering a top surface of the top conductive pad.

12. The semiconductor structure according to claim 9, further comprising:
a second bump pad disposed on the passivation layer and electrically connected to the plurality of conductive layers, wherein a height of the second bump pad is different than a height of the bump pad; and
a second conductive terminal disposed on the second bump pad.

13. The semiconductor structure according to claim 8, further comprising:
a bonding film disposed on the dielectric layer; and
a ground pad embedded in the bonding film and electrically connected to the top grounding vias.

14. The semiconductor structure according to claim 13, further comprising:
a carrier bonding-pad joined with the ground pad; and
an etch stop layer, a second dielectric layer and a second bonding film covering and contacting sidewalls of the carrier bonding-pad.

15. A semiconductor device, comprising:
a support structure;
a plurality of dies stacked over the support structure and bonded to the support structure through a bonding film, wherein each of the plurality of dies comprise:
a base substrate;
active components embedded in the base substrate;
an interconnection layer disposed on the base substrate, wherein the interconnection layer comprises a plurality of conductive layers;
a conductive pad disposed on and electrically connected to a topmost layer of the plurality of conductive layers of to the interconnection layer, wherein a plurality of via structures is directly joining the conductive pad to the topmost layer of the plurality of conductive layers; and
connecting vias disposed on and electrically connected to the interconnection layer, wherein the connecting vias are directly joined with the topmost layer of the plurality of conductive layers of the interconnection layer, and a bottom surface of the connecting vias is leveled with a bottom surface of the plurality of via structures;
a through substrate via electrically connecting the interconnection layer of one of the plurality of dies to the connecting vias of another one of the plurality of dies; and
conductive terminals disposed on and electrically connected to the plurality of dies, wherein the conductive terminals are disposed on and electrically connected to the conductive pad and the connecting vias of a topmost die of the plurality of dies.

16. The semiconductor device according to claim 15, wherein each of the plurality of dies further comprises:
a gap filling material covering side surfaces of the base substrate and the interconnection layer, wherein a sidewall of the gap filling material is aligned with a sidewall of the bonding film and a sidewall of the support structure.

17. The semiconductor device according to claim 15, wherein a width of the through substrate via is greater than a width of the connecting vias.

18. The semiconductor device according to claim 15, wherein the interconnection layer comprises the plurality of conductive layers and a plurality of conductive vias, and a width of the plurality of conductive vias is smaller than a width of the connecting vias.

19. The semiconductor device according to claim 15, further comprising:
a first bump pad disposed on the conductive pad; and
a second bump pad disposed on the connecting vias, wherein a profile of the first bump pad is different than a profile of the second bump pad, and the conductive terminals are disposed on and electrically connected to the first bump pad and the second bump pad.

20. The semiconductor device according to claim 15, further comprising a bonding pad disposed in between and electrically connecting the through substrate via of the one of the plurality of dies to the connecting vias of the another one of the plurality of dies.

* * * * *